US009236254B2

(12) United States Patent
Nishida et al.

(10) Patent No.: US 9,236,254 B2
(45) Date of Patent: Jan. 12, 2016

(54) SUBSTRATE HAVING THIN FILM AND METHOD OF THIN FILM FORMATION

(71) Applicant: JOLED INC., Tokyo (JP)

(72) Inventors: Kenichirou Nishida, Hyogo (JP); Tomohiko Oda, Osaka (JP); Yui Saitou, Osaka (JP)

(73) Assignee: JOLED INC., Tokyo (JP)

( * ) Notice: Subject to any disclaimer, the term of this patent is extended or adjusted under 35 U.S.C. 154(b) by 69 days.

(21) Appl. No.: 14/267,090

(22) Filed: May 1, 2014

(65) Prior Publication Data

US 2014/0231812 A1    Aug. 21, 2014

Related U.S. Application Data

(63) Continuation of application No. PCT/JP2011/006258, filed on Nov. 9, 2011.

(51) Int. Cl.
*H01L 21/36* (2006.01)
*H01L 21/02* (2006.01)
(Continued)

(52) U.S. Cl.
CPC .... *H01L 21/02675* (2013.01); *H01L 21/02422* (2013.01); *H01L 21/02488* (2013.01); *H01L 21/02532* (2013.01); *H01L 21/02595* (2013.01); *H01L 21/02683* (2013.01);
(Continued)

(58) Field of Classification Search
CPC ............... H01L 21/02691; H01L 27/1222; H01L 27/1229; H01L 27/1281; H01L 27/1285; H01L 27/1274
USPC ............................................ 438/487; 257/66
See application file for complete search history.

(56) References Cited

U.S. PATENT DOCUMENTS 6,479,837 B1 * 11/2002 Ogawa ................ H01L 21/2255
257/59
7,619,251 B2   11/2009 Sato et al.
(Continued)

FOREIGN PATENT DOCUMENTS

JP        05-021344        1/1993
JP        2005-108919      4/2005
(Continued)

OTHER PUBLICATIONS

U.S. Appl. No. 14/352,136 to Kenichirou Nishida, which was filed on Apr. 16, 2014.
(Continued)

*Primary Examiner* — Nicholas Tobergte
(74) *Attorney, Agent, or Firm* — Greenblum & Bernstein, P.L.C.

(57) ABSTRACT

A method of thin film formation includes: preparing a substrate; forming a thin film above the substrate; and crystallizing the thin film by irradiating the thin film with a light beam, in which the crystallizing includes steps of: crystallizing the thin film in a first region into a first crystalline thin film by irradiating the first region while scanning a first light beam relative to the substrate, the first region including at least one of: edge portions of the substrate; and a region through which a cutting line passes when the substrate is cut; and subsequently crystallizing the thin film in a second region into a second crystalline thin film by irradiating at least the second region while scanning a second light beam relative to the substrate, and the thin film has a higher absorption ratio of the second light beam than that of the first crystalline thin film.

13 Claims, 26 Drawing Sheets

(51) Int. Cl.
*H01L 21/268* (2006.01)
*H01L 29/04* (2006.01)
*H01L 29/66* (2006.01)
*H01L 29/786* (2006.01)
*H01L 27/12* (2006.01)

(52) U.S. Cl.
CPC ....... *H01L 21/02691* (2013.01); *H01L 21/268* (2013.01); *H01L 27/1285* (2013.01); *H01L 29/04* (2013.01); *H01L 29/66742* (2013.01); *H01L 29/66765* (2013.01); *H01L 29/786* (2013.01)

(56) References Cited

U.S. PATENT DOCUMENTS

| | | | |
|---|---|---|---|
| 8,440,581 B2* | 5/2013 | Im | B23K 26/0081 257/66 |
| 8,535,994 B2 | 9/2013 | Saito | |
| 8,623,715 B2 | 1/2014 | Nishida et al. | |
| 8,735,233 B2 | 5/2014 | Oda et al. | |
| 8,889,569 B2* | 11/2014 | Im | B23K 26/0081 257/66 |
| 2003/0230749 A1* | 12/2003 | Isobe | B23K 26/032 257/59 |
| 2005/0259709 A1* | 11/2005 | Das | B23K 26/04 372/55 |
| 2006/0001878 A1* | 1/2006 | Das | B23K 26/0066 356/400 |
| 2006/0270130 A1 | 11/2006 | Sato et al. | |
| 2008/0105879 A1* | 5/2008 | Kuramachi | H01L 21/02532 257/75 |
| 2008/0188012 A1* | 8/2008 | Yazaki | B23K 26/032 438/7 |
| 2010/0258808 A1* | 10/2010 | Cheng | H01L 29/78648 257/66 |
| 2011/0318891 A1 | 12/2011 | Oda et al. | |
| 2013/0037808 A1 | 2/2013 | Kishida et al. | |
| 2013/0161630 A1 | 6/2013 | Nishida | |
| 2014/0167049 A1* | 6/2014 | Oda | H01L 27/1285 257/57 |
| 2014/0231812 A1* | 8/2014 | Nishida | H01L 21/268 257/66 |
| 2014/0231813 A1* | 8/2014 | Oda | H01L 21/02532 257/66 |

FOREIGN PATENT DOCUMENTS

| | | |
|---|---|---|
| JP | 2006-203047 | 8/2006 |
| JP | 2006-332303 | 12/2006 |

OTHER PUBLICATIONS

International Search Report in International Patent Application No. PCT/JP2011/006258, dated Jan. 31, 2012.

* cited by examiner

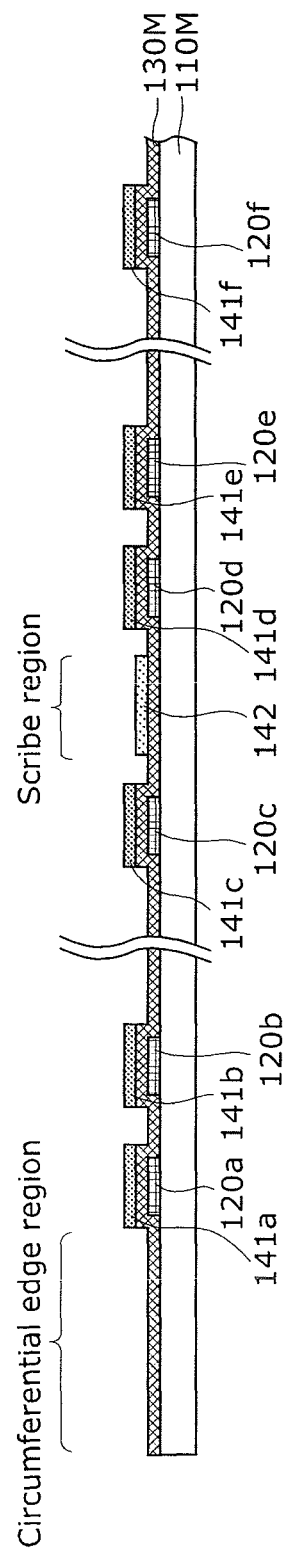

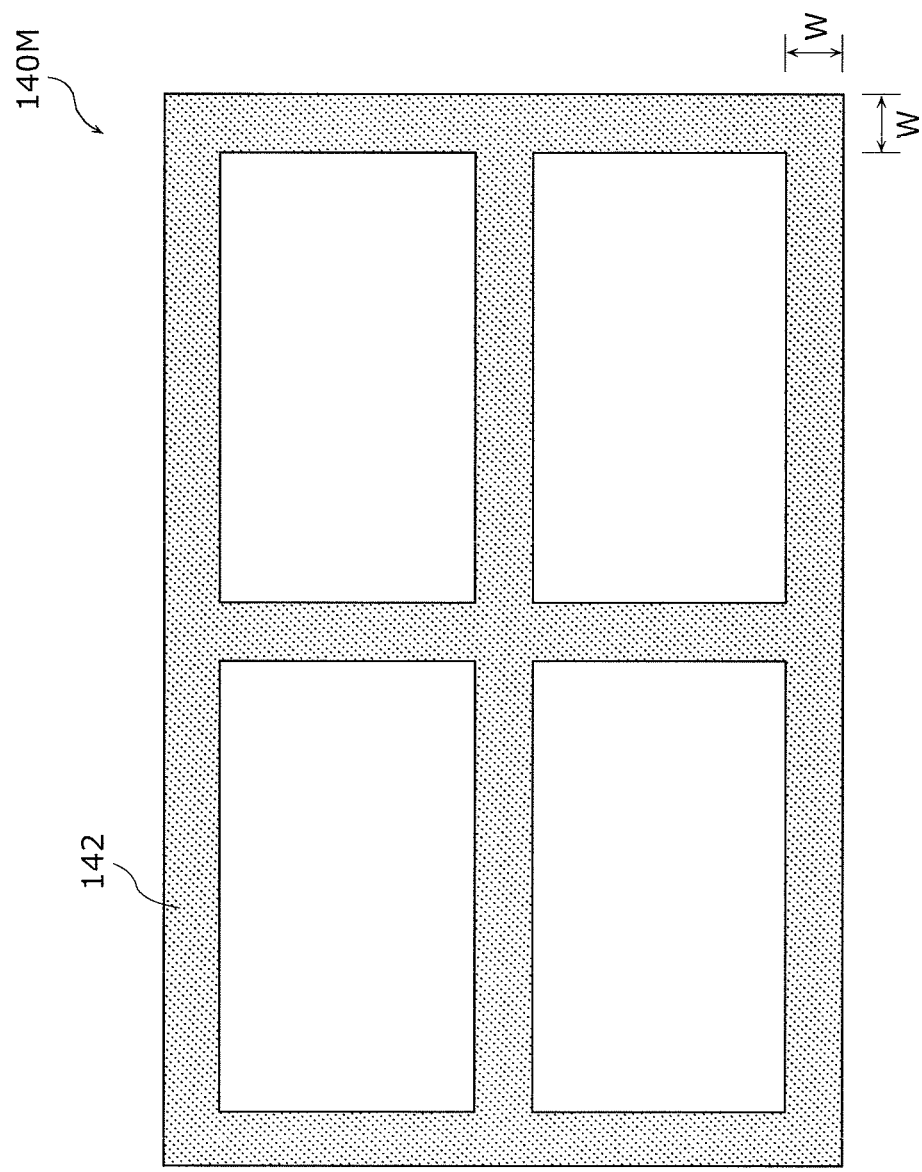

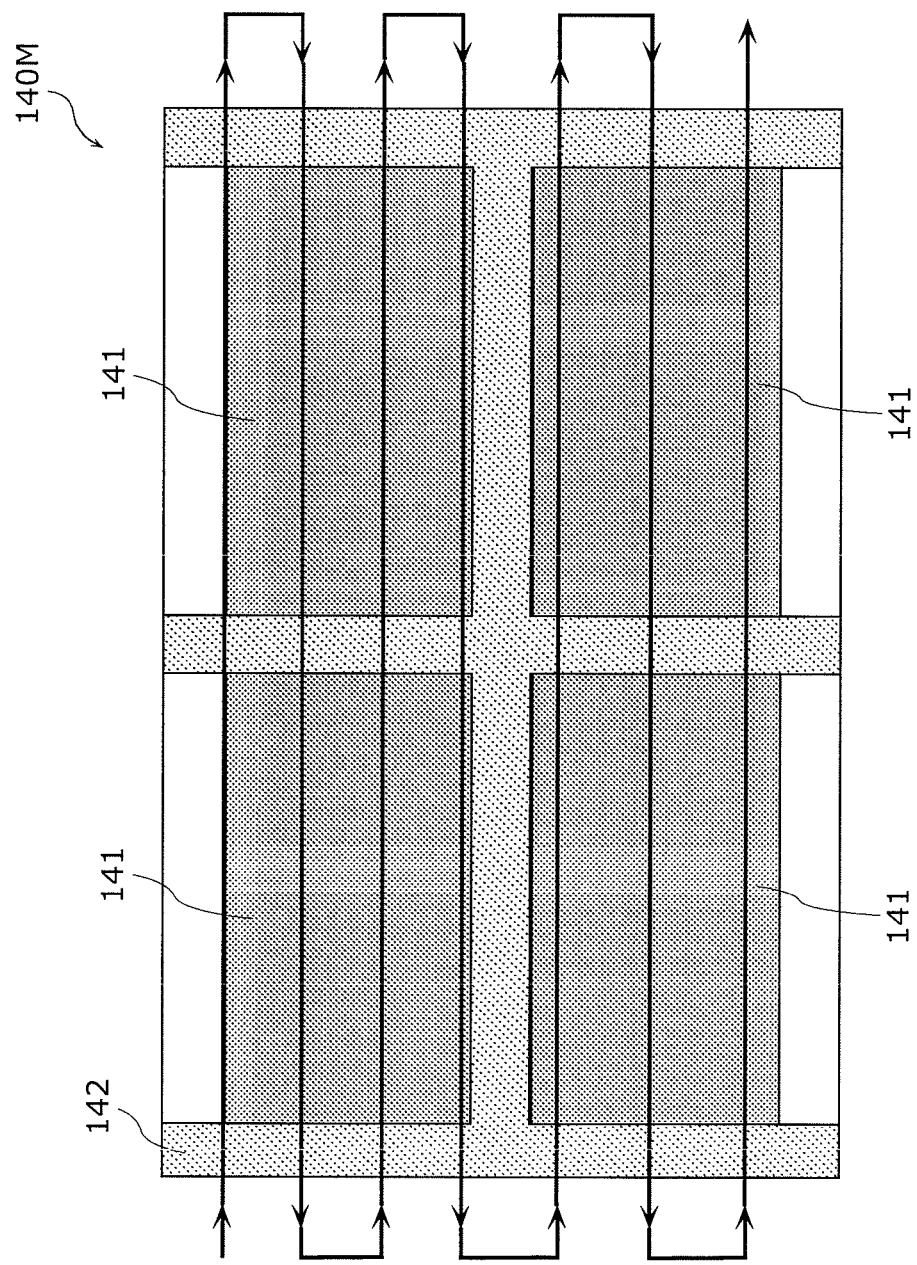

SUBSTRATE HAVING THIN FILM AND METHOD OF THIN FILM FORMATION

CROSS REFERENCE TO RELATED APPLICATION

This is a continuation application of PCT Patent Application No. PCT/JP2011/006258 filed on Nov. 9, 2011, designating the United States of America. The entire disclosure of the above-identified application, including the specification, drawings and claims is incorporated herein by reference in its entirety.

FIELD

One or more exemplary embodiments disclosed herein relate generally to a substrate having a thin film, and particularly to a substrate having a thin film included in a pixel circuit for a display device.

BACKGROUND

In recent years, organic EL displays using electroluminescence (EL) of an organic material have been attracting attention as a type of next-generation flat panel display replacing liquid crystal displays.

Unlike the voltage-driven liquid crystal display, the organic EL display is a current-driven display device. Accordingly, there is an urgent need for development of a thin-film transistor (TFT) having excellent characteristics as a driving circuit for the active-matrix display device. The thin-film transistor is used as a switching element for selecting a pixel, a driving transistor for driving a pixel, or others.

For example, a conventional thin-film transistor and a method for manufacturing the thin-film transistor are disclosed in Patent Literature (PTL) 1 and PTL 2. According to the PTL 1 and PTL 2, the thin-film transistor is manufactured by successively stacking thin films on the substrate. In order to improve the turn-on characteristics, it is known to crystallize a semiconductor film into a polycrystalline film by irradiating, with a laser, the semiconductor film which is to serve as a channel region.

CITATION LIST

Patent Literature

[PTL 1]
Japanese Unexamined Patent Application Publication No. 2006-332303
[PTL 2]
Japanese Unexamined Patent Application Publication No. 5-21344

SUMMARY

Technical Problem

Unfortunately, as shown in FIG. 11, a thin-film transistor manufactured according to the above method is disadvantageous in that a large number of cracks occur extending inwardly from the surface of a substrate. Referring to FIG. 12 as an example, the following describes why such cracks occur.

The surface of a substrate 900 inherently has a microcrack 910. Such a microcrack 910 always exists on the substrate 900 and does not affect the performance of a thin-film transistor. The substrate 900 is, however, heated due to laser irradiation to a semiconductor film stacked above the substrate 900 and cooled down, which generates tensile stress in a direction of an arrow shown in FIG. 12. Such tensile stress will grow the microcrack 910 to a large crack 920.

This disadvantage is particularly prominent around the substrate having a large number of microcracks 910. Even if no crack 920 occurs when cooling the substrate, a large number of cracks occur when cutting the substrate 900 due to the residual tensile stress in the substrate 900.

In view of the foregoing disadvantage, one non-limiting and exemplary embodiment provides a substrate having a thin film for preventing cracks in the substrate and a method of forming the thin film.

Solution to Problem

In one general aspect, the techniques disclosed here feature a method of thin film formation including: preparing a substrate; forming a thin film above the substrate; and crystallizing the thin film by irradiating the thin film with a light beam. The crystallizing includes steps of: (a) crystallizing the thin film in a first region into a first crystalline thin film by irradiating the first region while scanning a first light beam relative to the substrate, the first region including at least one of (i) edge portions of the substrate and (ii) a region through which a cutting line passes when the substrate is cut, the first light beam satisfying a first condition; and (b) subsequently crystallizing the thin film in a second region into a second crystalline thin film by irradiating at least the second region while scanning a second light beam relative to the substrate, the second region being different from the first region, the second light beam satisfying a second condition different from the first condition. The thin film has a higher absorption ratio of the second light beam than an absorption ratio of the second light beam of the first crystalline thin film.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

One or more exemplary embodiments or features disclosed herein provide a substrate having a thin film for preventing cracks in the substrate and a method of forming the thin film.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2G is a sectional view schematically showing a channel layer formation in the method of manufacturing the thin-film semiconductor device according to one exemplary embodiment.

FIG. 3A illustrates an exemplary position between a first region and a second region.

FIG. 5B illustrates another exemplary irradiation area of the laser beam in the polycrystalline silicon layer formation.

DESCRIPTION OF EMBODIMENT

Figure 1:
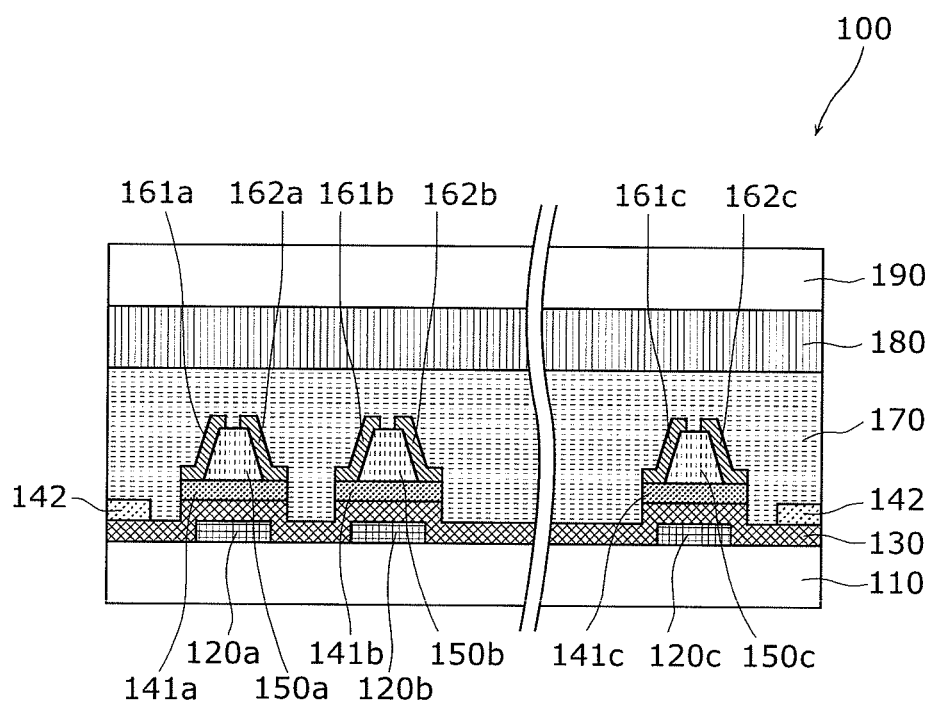
FIG. 1 is a sectional view showing a structure of a thin-film semiconductor device according to one exemplary embodiment.

According to an exemplary embodiment disclosed herein, a method of thin film formation includes: preparing a substrate; forming a thin film above the substrate; and crystallizing the thin film by irradiating the thin film with a light beam. The crystallizing includes steps of: (a) crystallizing the thin film in a first region into a first crystalline thin film by irradiating the first region while scanning a first light beam relative to the substrate, the first region including at least one of (i) edge portions of the substrate and (ii) a region through which a cutting line passes when the substrate is cut, the first light beam satisfying a first condition; and (b) subsequently crystallizing the thin film in a second region into a second crystalline thin film by irradiating at least the second region while scanning a second light beam relative to the substrate, the second region being different from the first region, the second light beam satisfying a second condition different from the first condition. The thin film has a higher absorption ratio of the second light beam than an absorption ratio of the second light beam of the first crystalline thin film.

In this way, it is possible to effectively prevent a crack in the substrate covered with the first region by crystallizing the thin film in the first region into the first crystalline thin film having a lower absorption rate of the second light beam before crystallizing the thin film in the second region into the second crystalline thin film.

Furthermore, in step (b), the first region may be also irradiated with the second light beam.

Furthermore, in step (b), the first region and the second region may be consecutively irradiated with the second light beam.

In this way, it is possible to prevent the first region from being heated intensely even if the first region is irradiated with the second light beam in step (b) because the thin film in the first region is crystallized into the first crystalline thin film having a lower absorption rate of the second light beam in step (a).

Furthermore, crystal grains in the first crystalline thin film may have an average grain size smaller than an average grain size of crystal grains in the second crystalline thin film.

For example, crystal grains in the first crystalline thin film may have an average grain size of from 10 nm to 40 nm, and crystal grains in the second crystalline thin film may have an average grain size of from 50 nm to 1 μm.

Furthermore, the method may include, after steps (a) and (b), cutting the substrate in a way that the cutting line is in the first region.

Furthermore, the substrate prepared in the preparing may have one of a microcrack, a chipping, and a notch in a region to be covered with the first region.

Furthermore, the edge portions in which the first crystalline thin film is formed may include only a part of the edge portions that intersects a relative scan direction of the second light beam.

In this way, it is possible to easily exclude edge portions parallel to the scan direction from the area to be irradiated with the second light beam by adjusting a scan starting/ending position of the second light beam.

For example, the method may be included in a method of forming a thin-film transistor on the substrate, and the second crystalline thin film may include a channel region of the thin-film transistor.

For example, the light beam may be a continuous-wave laser beam.

In particular, the laser beam may have a wavelength of from 400 nm to 900 nm.

More specifically, the laser beam may have a wavelength of 532 nm.

Furthermore, the thin film may be composed of a silicon-containing material.

According to an exemplary embodiment disclosed herein, a substrate having a thin film includes: the substrate; and the thin film formed above the substrate. The thin film is partitioned into a first region and a second region, the first region being in contact with one of edges of the substrate, the second region being in contact with the first region and closer to a center of the substrate than the first region. The first region and the second region are obtained by crystallizing a silicon-containing material, and the first region and the second region include microcrystalline silicon having an average grain size of from 10 nm to 40 nm and polycrystalline silicon having an average grain size of from 50 nm to 1 μm, respectively.

With this, the first region having a small average grain size serves as a stress buffer layer for buffering the stress acting on the substrate. Accordingly, it is possible to effectively prevent a crack in the substrate.

For example, the thin film may be included in a thin-film transistor formed on the substrate, and the second region may include a channel region of the thin-film transistor.

Hereinafter, certain exemplary embodiments are described in greater detail with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Embodiment

Referring to FIG. 1, the following describes a structure of a substrate having a thin film according to one exemplary embodiment. FIG. 1 is a schematic sectional view showing a structure of a thin-film semiconductor device 100 which is an example of the substrate having the thin film according to the embodiment.

As shown in FIG. 1, the thin-film semiconductor device 100 includes a substrate 110, gate electrodes 120a, 120b, and 120c, a gate insulating film 130, portions of polycrystalline silicon layer 141a, 141b, and 141c, a microcrystalline silicon layer 142, portions of channel protective layer 150a, 150b, and 150c, source electrodes 161a, 161b, and 161c, drain electrodes 162a, 162b, and 162c, an interlayer insulating film 170, an EL layer 180, and a front glass 190, which are stacked in this order.

The thin-film semiconductor device 100 shown in FIG. 1 is implemented as a display panel having pixels, for example. The thin-film semiconductor device 100 includes a bottom-gate thin-film transistor for each of the pixels.

For example, the substrate 110 is a glass substrate composed of a glass material such as silica glass, alkali-free glass, or highly heat-resistant glass. An undercoat layer composed of silicon nitride ($SiN_x$), silicon oxide ($SiO_y$), silicon oxynitride ($SiO_yN_x$), or others may be formed on the substrate 101 in order to prevent impurities in the glass substrate, such as sodium and phosphorus, from penetrating the portions of the polycrystalline silicon layer 141a, 141b and 141c. The undercoat layer also serves as a layer for reducing the effect of heat on the substrate 110 in a high-temperature heat treatment such as laser annealing. The undercoat layer may have a thickness of approximately 100 to 2000 nm, for example.

The gate electrode 120a is formed on the substrate 110 by patterning into a predetermined shape. The gate electrode 120a may be composed of molybdenum (Mo), aluminum (Al), copper (Cu), tungsten (W), titanium (Ti), chromium (Cr), molybdenum-tungsten (MoW), or the like. The gate electrode 120a may have a thickness of approximately 20 to 500 nm, for example. The same applies, mutatis mutandis, to the gate electrodes 120b and 120c.

The gate insulating film 130 is formed over the entire substrate 110 to cover the gate electrodes 120a, 120b, and 120c. For example, the gate insulating film 130 may be composed of silicon oxide ($SiO_y$), silicon nitride ($SiN_x$), silicon oxynitride ($SiO_yN_x$), aluminum oxide ($AlO_z$), tantalum oxide ($TaO_w$), or a multilayer film thereof. The gate insulating film 130 has a thickness of 50 to 300 nm, for example.

As described below, the portions of the polycrystalline silicon layer 141a, 141b, and 141c according to the embodiment are formed of a crystalline-silicon thin film. Accordingly, it is desirable to use silicon oxide for the gate insulating film 130. Silicon oxide is suitable to have good interface state between the portions of the polycrystalline silicon layer 141a, 141b, and 141c and the gate insulating film 130, and thus the thin-film semiconductor device 100 has improved threshold voltage characteristics.

The portion of the polycrystalline silicon layer 141a is a semiconductor film formed on the gate insulating film 130 at a position covering the gate electrode 120a by patterning a layer, and includes a predetermined channel region in which movement of carriers are controlled by the voltage applied to the gate electrode 120a. The same applies, mutatis mutandis, to the portions of the polycrystalline silicon layer 141b and 141c.

The microcrystalline silicon layer 142 is a semiconductor film formed on the gate insulating film 130 in edge portions (a circumferential edge portion) of the substrate 110 by patterning the same layer as the portions of the polycrystalline silicon layer 141a, 141b, and 141c. The microcrystalline silicon layer 142 serves as a stress buffer layer for buffering stress acting on the substrate 110, such as external force in the conveying of the thin-film semiconductor device 100 or thermal stress in long-term use of the thin-film semiconductor device. In other words, it is possible to effectively prevent a crack from occurring and growing on the substrate 110 due to the external force and the thermal stress acting on the thin-film semiconductor device 100.

For example, the microcrystalline silicon layer 142 is formed by irradiating non-crystalline silicon (amorphous silicon) with a first light beam to achieve solid phase crystallization of the non-crystalline silicon. On the other hand, the polycrystalline silicon layer 141a is formed by irradiating the non-crystalline silicon (amorphous silicon) with a second light beam to crystallize the non-crystalline silicon through the fusion range. The first light beam satisfying the first condition and the second light beam satisfying the second condition are described below.

The microcrystalline silicon layer 142 may include non-crystalline silicon in a space between microcrystal grains. This means that a part of non-crystalline components in the non-crystalline silicon which are precursors to form the microcrystalline silicon layer 142 remains in the microcrystalline silicon layer 142 as the non-crystalline components without crystallizing into microcrystal grains.

Thus, the microcrystalline silicon layer 142 is formed at a temperature lower than that of the polycrystalline silicon layer 141a, 141b, and 141c, thereby reducing the thermal stress in the microcrystalline silicon layer 142 in comparison with the thermal stress in the polycrystalline silicon layer 141a, 141b, and 141c. Furthermore, when the microcrystalline silicon layer 142 includes non-crystalline silicon components in the space between the microcrystal grains, the non-crystalline silicon components themselves are flexible against the external force or the like. Accordingly, it is possible to effectively prevent a crack from occurring and growing on the substrate 110 due to the external force and the thermal stress acting on the thin-film semiconductor device 100.

The crystal grains in the polycrystalline silicon layer 141a have an average grain size of approximately 50 to 1000 nm. On the other hand, the crystal grains in the microcrystalline silicon layer 142 have an average grain size of approximately 10 to 40 nm. In other words, the crystal grains in the microcrystalline silicon layer 142 have an average grain size smaller than the average grain size of the crystal grains in the polycrystalline silicon layer 141a.

Furthermore, the polycrystalline silicon layer 141a and the microcrystalline silicon layer 142 each have a thickness of approximately 30 to 100 nm, for example. It is desirable that a silicon crystal in the polycrystalline silicon layer 141a has a primary orientation of (100). Accordingly, it is possible to form the excellent polycrystalline silicon layer 141a.

The portion of the channel protective layer 150a is formed above the portion of the polycrystalline silicon layer 141a, and serves as a channel etching stopper (CES) layer for protecting the portion of the polycrystalline silicon layer 141a. In other words, the portion of the channel protective layer 150a prevents the portion of the polycrystalline silicon layer 141a from being etched in an etching process to form the source electrode 161a and the drain electrode 162a. The same applies, mutatis mutandis, to the portion of the channel protective layers 150b and 150c.

For example, the channel protective layer 150a may be composed of an organic material mainly containing an organic material including silicon, oxygen, and carbon. The channel protective layer 150a according to the embodiment may be formed by patterning and solidifying a photosensitive-coating organic material.

The organic material of the channel protective layer 150a includes, for example, an organic resin material, a surface-active agent, a solvent, and a photosensitizing agent. The organic resin material may be a photosensitive or non-photosensitive organic resin material composed of polyimide, acrylic, polyamide, polyimide-amide, resist, benzocyclobutene, or any combination thereof. The surface-active agent may be a surface-active agent composed of a silicon compound such as siloxane. The solvent may be an organic solvent such as propylene glycol monomethyl ether acetate or 1,4-dioxane. The photosensitizing agent may be a positive photosensitizing agent such as naphthoquinone diazido. The photosensitizing agent, however, includes not only carbon but also sulfur.

The channel protective layer 150a may be formed by applying the above-mentioned organic material by spin coating or the like. Instead of the spin coating, another technique such as droplet deposition may be used to form the channel protective layer 150a. For example, the organic material may be selectively formed in a predetermined pattern by a printing technique, such as screen printing or offset printing, which allows formation of the predetermined pattern.

The channel protective layer 150a may have a thickness of 300 to 1000 nm, for example. The lower limit of the thickness of the channel protective layer 150a is determined taking into account a margin for etching, to suppress the effect of fixed charge in the channel protective layer 150a. On the other hand, the upper limit of the channel protective layer 150a is determined to suppress a decrease in reliability of a manufacturing process of the source electrode 161a and the drain electrode 162a with an increase in step height.

The source electrode 161a and the drain electrode 162a are formed on the portion of the channel protective layer 150a at a position covering the portion of the polycrystalline silicon layer 141a by patterning. The source electrode 161a and the drain electrode 162a are disposed opposite each other and spaced at a predetermined distance from each other. The same applies, mutatis mutandis, to the source electrodes 161b and 161c and the drain electrodes 162b and 162c.

In the embodiment, the source electrode 161a and the drain electrode 162a each may have a single-layer structure or multilayer structure comprising a conductive material, an alloy of a conductive material, or the like. The examples include aluminum (Al), molybdenum (Mo), tungsten (W), copper (Cu), titanium (Ti), and chromium (Cr). In the embodiment, the source electrode 161a and the drain electrode 162a each have a try-layer structure of MoW/Al/MoW. The source electrode 161a and the drain electrode 162a each may have a thickness of approximately 100 to 500 nm, for example.

A back channel layer (not shown) may be further formed between the polycrystalline silicon layer 141a and the channel protective layer 150a. For example, the back channel layer is composed of an amorphous silicon film (true amorphous silicon) purposefully undoped with impurities. The back channel layer has a higher local state density (trap density) than the polycrystalline silicon layer 141a. In other words, the electric field is shielded by compensating the positive fixed charge in the channel protective layer 150a with the charge density of negative carriers in the back channel layer. In this way, it is possible to control the formation of the back channel to reduce a leakage current in turn-off of a thin-film transistor, thereby improving turn-off characteristics of the thin-film transistor.

A contact layer (not shown) may be further formed between the portion of the channel protective layer 150a and the source electrode 161a or the drain electrode 162a. The contact layer is a non-crystalline semiconductor film containing impurities at high density, and is particularly an $n^+$ layer containing impurities at high density of at least $1 \times 10^{19}$ (atm/cm$^3$). More specifically, the contact layer may be composed of an n-type semiconductor layer obtained by doping amorphous silicon with phosphorus (P) serving as the impurities. The contact layer may have a thickness of 5 to 100 nm, for example.

Furthermore, the contact layer may be composed of two layers: a lower electric-field buffer layer ($n^-$ layer) having a low density; and an upper contact layer ($n^+$ layer) having a high density. The electric-field buffer layer is doped with phosphorus at density of $1 \times 10^{17}$ (atm/cm$^3$). The two layers can be successively formed using a chemical vapor deposition (CVD) apparatus.

The interlayer insulating film 170 is stacked over the entire substrate 110 to cover the source electrodes 161a, 161b, and 161c, the drain electrode 2 162a, 162b, and 163c, and the microcrystalline silicon layer 142. For example, the interlayer insulating film 170 may be composed of a single layer of silicon oxide ($SiO_y$), silicon nitride ($SiN_x$), silicon oxynitride ($SiO_yN_x$), aluminum oxide ($AlO_z$), or tantalum oxide ($TaO_w$), or a multilayer film thereof. The interlayer insulating film 170 serves as a flattened film having a flat top surface.

The EL layer 180 includes an anode formed for each pixel, a luminescent layer formed for each pixel, and a cathode shared by all the pixels. A bank is formed between the adjacent anodes (luminescent layers).

The anode is a reflecting electrode composed of one of: a conductive metal such as molybdenum, aluminum, gold, silver, or copper, or an alloy thereof; an organic conductive material such as PEDOT:PSS; zinc oxide; and lead-mixed indium oxide. On the other hand, the cathode is a transparent electrode composed of ITO, $SnO_2$, $In_2O_3$, ZnO, or any combination thereof, for example.

The luminescent layer is formed by stacking a hole injection layer, a hole transport layer, a luminescent layer, an electron transport layer, an electron injection layer, and others. For example, the hole injection layer, the hole transport layer, the luminescent layer, the electron transport layer, and the electron injection layer may be composed of copper phthalocyanine, α-NPD (Bis[N-(1-Naphthyl)-N-Phenyl]benzidine), $Alq_3$ (tris(8-hydroxyquinoline)aluminum), oxazole derivative, and $Alq_3$, respectively.

The front glass 190 is a transparent glass stacked on the EL layer 180. The front glass 190 is for protecting the EL layer 180, and may be composed of the same material as the substrate 110, for example. Instead of the glass, transparent resin or the like may be used as the material of the front glass 190.

Referring to FIG. 2A to FIG. 2M, a method for manufacturing the thin-film semiconductor device according to the embodiment is described. FIG. 2A to FIG. 2M are sectional views schematically showing the respective steps in the method for manufacturing the thin-film semiconductor device according to the embodiment.

Figure 2A:
FIG. 2A is a sectional view schematically showing a substrate preparation in a method of manufacturing the thin-film semiconductor device according to one exemplary embodiment.

Firstly, as shown in FIG. 2A, a mother substrate 110M is prepared. For example, the mother substrate 110M has a size several times larger than that of the substrate 110 in FIG. 1. After the formation of thin-film transistors, the mother substrate is cut into the size of the substrate 110. More specifically, the mother substrate 110M may be a G8 substrate having a size of 2200 mm×2500 mm. The mother substrate 110M includes microcracks, chippings, notches, or others. These occur in the manufacturing or conveying of the mother substrate 110M, and do not directly affect the performance of the thin-film semiconductor device 100.

Furthermore, an under coat layer composed of a silicon nitride film, a silicon oxide film, a silicon oxynitride film, or the like may be formed on the mother substrate 110M by the plasma CVD before the formation of the gate electrodes 120a to 120f.

Figure 2B:
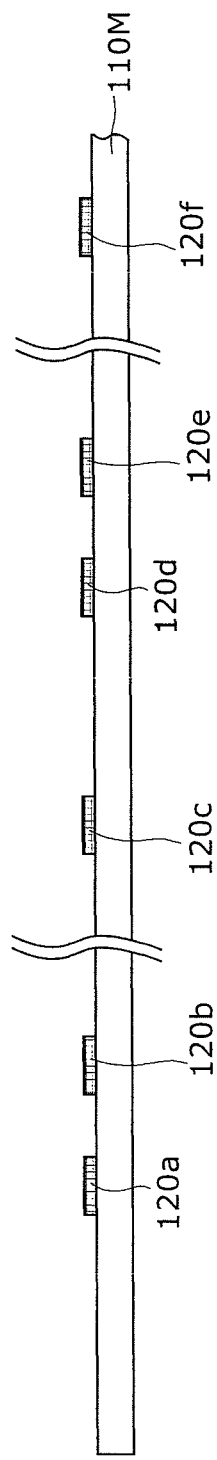
FIG. 2B is a sectional view schematically showing a gate electrode formation in the method of manufacturing the thin-film semiconductor device according to one exemplary embodiment.

Subsequently, as shown in FIG. 2B, the gate electrodes 120a, 120b, 120c, 120d, 120e, 120f are formed in a predetermined pattern on the mother substrate 110M. For example, the gate electrodes 120a, 120b, 120c, 120d, 120e, 120f may be formed in the predetermined pattern by growing a gate metal film composed of MoW on the mother substrate 110M through sputtering and patterning the gate metal film using photolithography and wet etching. For example, the wet etching of MoW may use solution containing phosphoric acid ($HPO_4$), nitric acid ($HNO_3$), acetic acid ($CH_3COOH$), and water at a predetermined ratio.

Figure 2C:
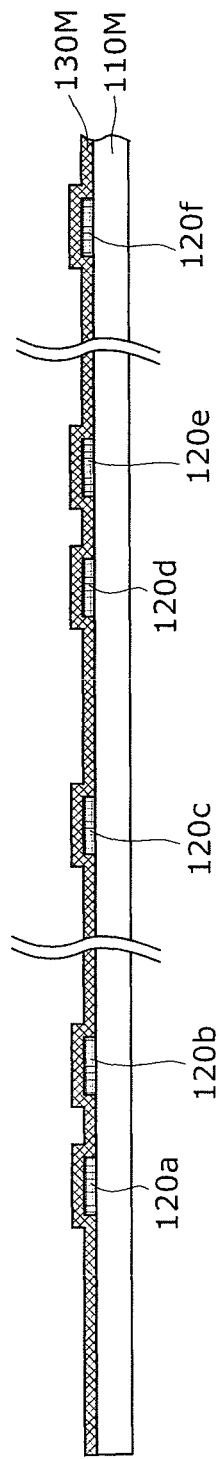
FIG. 2C is a sectional view schematically showing a gate insulating film formation in the method of manufacturing the thin-film semiconductor device according to one exemplary embodiment.

Subsequently, as shown in FIG. 2C, the gate insulating film 130M is formed on the entire mother substrate 110M to cover the gate electrodes 120a to 120f. For example, the gate insulating film 130M composed of oxide silicon is grown by the plasma CVD or the like. The oxide silicon film may be grown, for example, by introducing silane gas ($SiH_4$) and nitrous oxide gas ($N_2O$) at a predetermined concentration ratio.

Figure 2D:
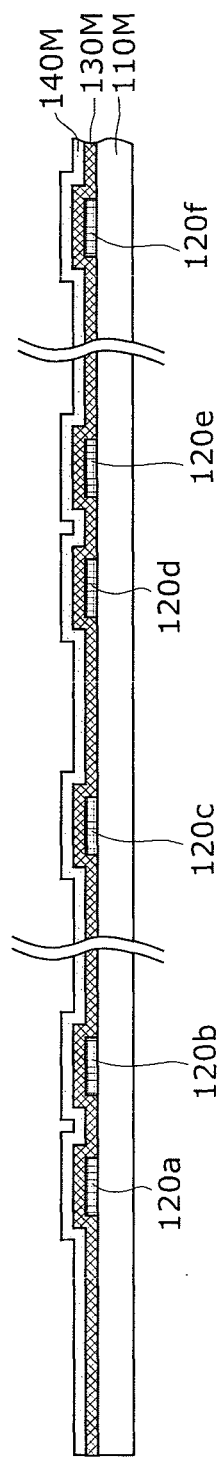
FIG. 2D is a sectional view schematically showing a silicon thin film formation in the method of manufacturing the thin-film semiconductor device according to one exemplary embodiment.

Subsequently, as shown in FIG. 2D, a non-crystalline silicon thin film 140M is formed over the entire top surface of the gate insulating film 130M. For example, the silicon thin film 140M composed of amorphous silicon (non-crystalline silicon) may be grown by the plasma CVD or the like. In particular, the silicon thin film 140M may be grown, for example, by introducing silane gas ($SiH_4$) and hydrogen gas ($H_2$) at a predetermined concentration ratio. After the growth of the silicon thin film 140M, a dehydrogenation annealing is performed at a temperature of 500 degrees C.

Figure 2E:
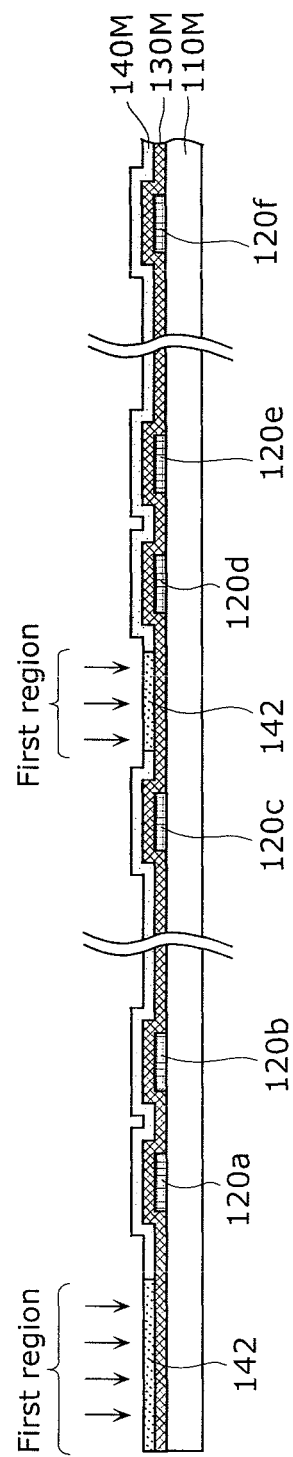
FIG. 2E is a sectional view schematically showing a microcrystalline silicon layer formation in the method of manufacturing the thin-film semiconductor device according to one exemplary embodiment.

Subsequently, as shown in FIG. 2E, the first region of the non-crystalline silicon thin film 140M is irradiated with the first light beam satisfying the first condition, thereby crystallizing the silicon thin film 140M in the first region into the microcrystalline silicon layer (the first crystalline thin film) 142. The first condition is a condition such that the silicon thin film 140M is heated to a temperature range below the melting point of amorphous silicon (for example, 600 to 1100 degrees C., hereinafter referred to as "SPC range"). Accordingly, the solid phase crystallization (SPC) of the amorphous silicon is achieved, resulting in SPC silicon (microcrystalline silicon) having an average grain size of approximately 30 nm.

Referring to FIG. 3A to FIG. 4B, a microcrystalline silicon layer formation is described in detail.

Figure 3B:
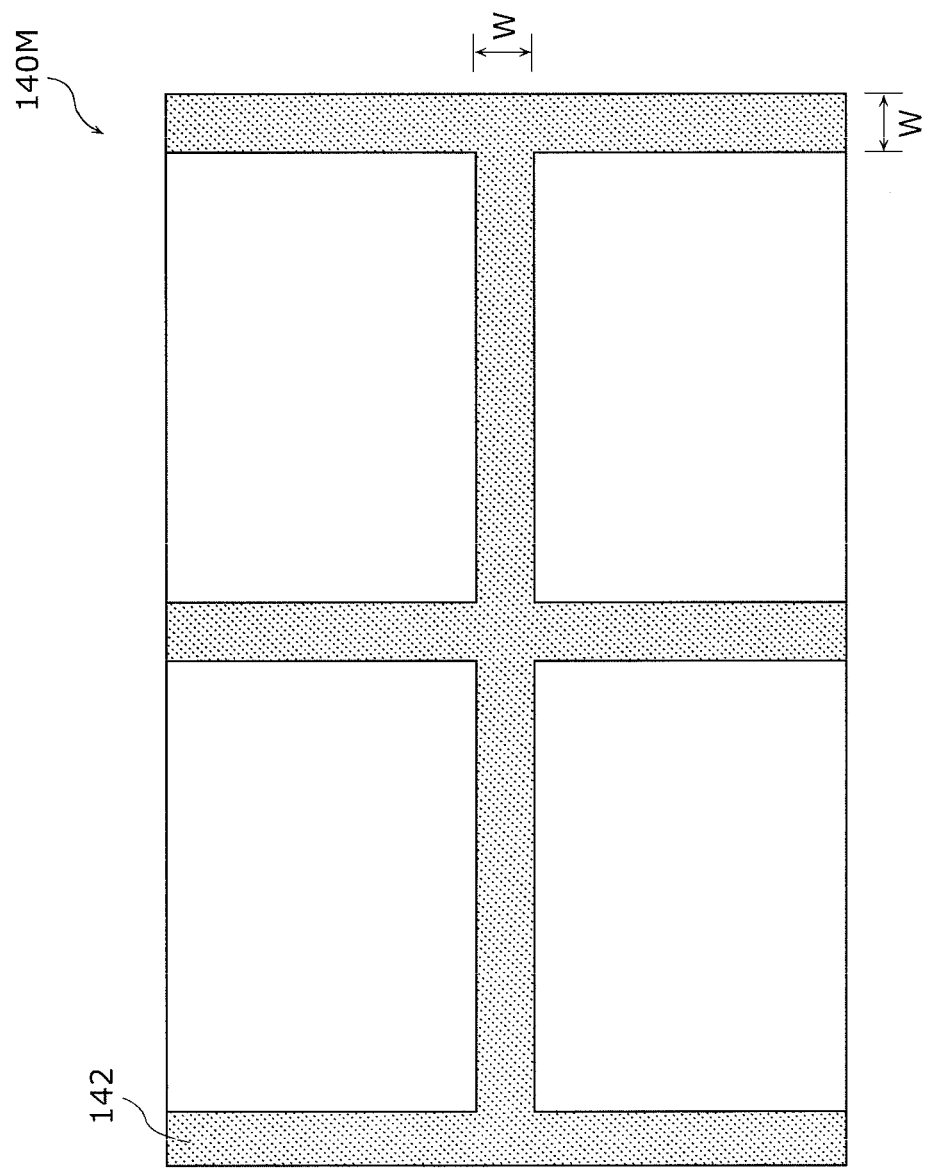
FIG. 3B illustrates another exemplary position between the first region and the second region.
Figure 4A:
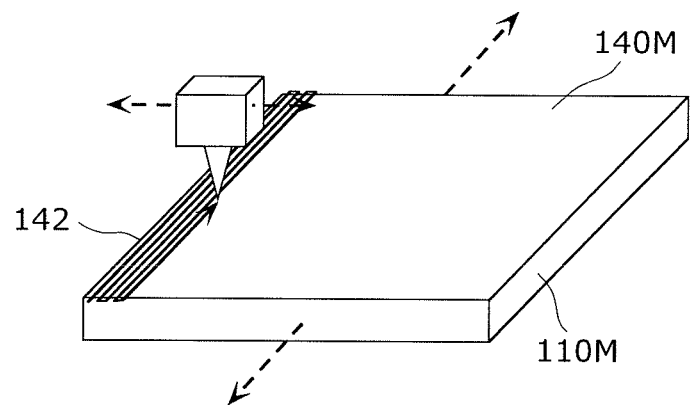
FIG. 4A illustrates an exemplary CW laser irradiation to the first region.
Figure 4B:
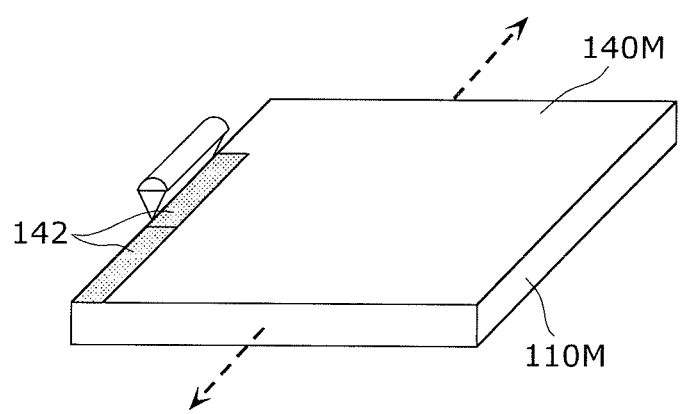
FIG. 4B illustrates an exemplary excimer laser irradiation to the first region.

FIG. 3A and FIG. 3B each illustrate a position between a first region (hatched region) and a second region (non-hatched region) on the surface of the non-crystalline silicon thin film 140M. FIG. 4A and FIG. 4B each illustrate a specific example of a laser irradiation used in the microcrystalline silicon layer formation.

As shown in FIG. 3A, the first region refers to at least one of (i) edge portions (a circumferential edge region) of the mother substrate 110M and (ii) a region through which a cutting line passes (a scribe region) when the mother substrate 110M is cut in a post process. The first region has a width W of approximately 5 to 10 mm, for example. The first region, however, need not include the entire circumferential edge region of the mother substrate 110M. For example, the first region may include only one of two pairs of opposite sides of the mother substrate 110M (in the case of FIG. 3B, a pair of short sides).

As shown in FIG. 4A, a CW laser may be used in the laser irradiation to the first region. The CW laser is a continuous-wave laser continuously emitted to the silicon thin film 140M to be crystallized. The CW laser is also used in a polycrystalline silicon layer formation which is described below. Accordingly, a CW laser device can be shared between the two processes.

A laser device shown in FIG. 4A emits a laser beam having a beam shape of 5 mm×30 μm and a wave length of 400 to 900 nm (preferably, 532 nm), for example. The silicon thin film 140M is irradiated with the CW laser emitted from the laser device, while moving a stage (not shown) on which the mother substrate 110M is disposed in the first direction (for example, in a back-and-forth direction in FIG. 4A). Every time the moving direction of the stage changes (the moving direction changes from a back-to-front direction to a front-to-back direction, or the moving direction changes from the front-to-back direction to the back-to-front direction), the laser device is moved toward a direction orthogonal to the first direction (for example, in a left-and-right direction in FIG. 4A) by the width of the CW laser. The repetition of this movement allows only the first region of the silicon thin film 140M to be selectively irradiated with the CW laser.

The forgoing laser irradiation is, however, merely an example. For example, only the laser device may be moved without moving the stage at all, or vice versa. In other words, the laser beam should scan the first region by a relative movement between the laser device and the stage. The same applies, mutatis mutandis, to the following laser irradiation.

Furthermore, instead of the CW laser, as shown in FIG. 4B, an excimer laser may be used in the laser irradiation to the first region. For example, the excimer laser has a beam shape of 730 mm×30 μm. In other words, the excimer laser has a laser width greater than that of the CW laser, and thus a larger region can be crystallized at once. Accordingly, it is possible to reduce the number of back-and-forth stage movements described with reference to FIG. 4A.

Figure 2F:
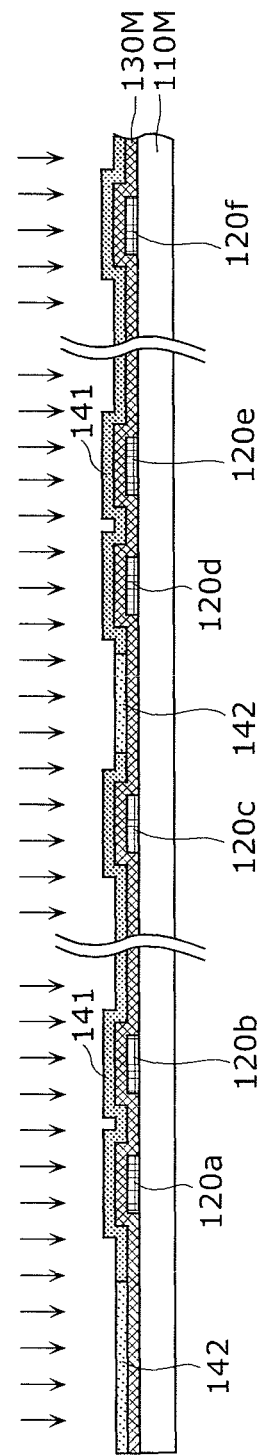
FIG. 2F is a sectional view schematically showing a polycrystalline silicon layer formation in the method of manufacturing the thin-film semiconductor device according to one exemplary embodiment.

Subsequently, as shown in FIG. 2F, at least the second region of the silicon thin film 140M is irradiated with the second light beam satisfying the second condition, thereby crystallizing the silicon thin film 140M in the second region into the polycrystalline silicon layer (the second crystalline thin film) 141. The second condition is a condition such that the silicon thin film 140M is heated to a temperature range above 1414 degrees C. which is the melting point of amorphous silicon. Accordingly, silicon to be crystallized through the fusion range is melted with a decrease in its volume and then crystallized with an increase in its volume, resulting in p-Si (polycrystalline silicon) having an average grain size of at least 50 nm.

Figure 5A:
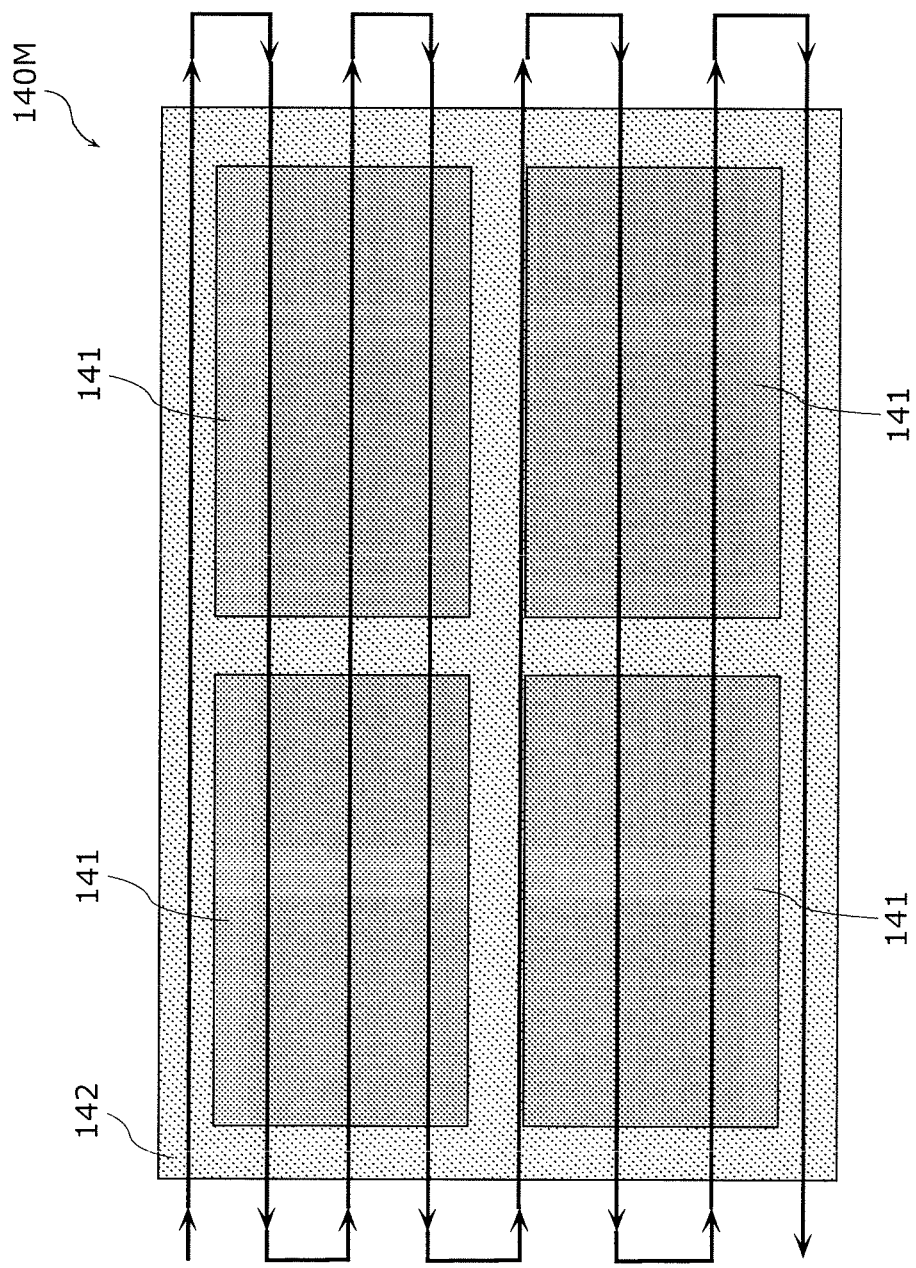
FIG. 5A illustrates an exemplary irradiation area of a laser beam in the polycrystalline silicon layer formation.

Referring to FIG. 5A and FIG. 5B, the polycrystalline silicon layer formation is described in detail. FIG. 5A and FIG. 5B each illustrate an irradiation area of a laser beam in the polycrystalline silicon layer formation. For example, a CW laser having a beam shape of 5 mm×30 μm and a wavelength of 400 to 900 nm (preferably, 532 nm) is used in the laser irradiation in the polycrystalline silicon layer formation.

In the polycrystalline silicon layer formation, both of the first region in which the microcrystalline silicon is formed in a preceding process and the second region in which the noncrystalline amorphous silicon still remains are irradiated with the laser beam. For example, as shown in FIG. 3A, in the case where all the edge portions of the mother substrate 110M are included in the first region, the entire mother substrate 110M is irradiated with the CW laser as indicated by an arrow in FIG. 5A.

It should be noted that the microcrystalline silicon differs from the amorphous silicon in an absorption ratio of the CW laser having the above-mentioned wave length. More specifically, the microcrystalline silicon has the absorption ratio of approximately 9.6%, while the amorphous silicon has the absorption ratio of approximately 40.1%. Accordingly, in the first region in which the microcrystalline silicon has been already formed, most of the laser beam passes through the silicon thin film 140M, and thus the first region is heated slightly. In contrast, in the second region of the amorphous silicon, the laser beam is absorbed into the silicon thin film 140M, and thus the second region is heated to the melting point of the amorphous silicon or more. As a result, the silicon thin film 140M in the second region is selectively crystallized into the polycrystalline silicon layer 141.

The selective polycrystallization of only the silicon thin film 140M in the second region is also possible by masking an area corresponding to the first region. The formation and removal of the mask, however, require even more steps than the forgoing microcrystalline silicon layer formation. Alternatively, the selective polycrystallization of only the silicon thin film 140M in the second region is also possible by stopping the laser irradiation at a position corresponding to the first region. It is, however, extremely hard to control ON/OFF operation of the laser beam while keeping the current relative-scan speed.

Accordingly, as described in the method for manufacturing the thin-film semiconductor device according to the embodiment, the silicon thin film 140M in the first region is crystallized into the microcrystalline silicon in advance in the microcrystalline silicon layer formation, thereby relative simply achieving the selective polycrystallization of only the silicon thin film 140M in the second region.

Although FIG. 5A illustrates an exemplary laser irradiation in which the entire silicon thin film 140M is irradiated with the second laser beam, it need not be emitted to the entire silicon thin film 140M. For example, as shown in FIG. 5B, in the case where only one of two pairs of opposite sides of the mother substrate 110M (a pair of short sides) is included in the first region as shown in FIG. 3B, the edge portions (non-hatched regions in FIG. 5B) on the other (a pair of long sides) may be excluded from the area to be irradiated with the second light beam. In this case, it is desirable to scan the laser beam in a direction parallel to a side excluded from the irradiation area (in the case of FIG. 5B, a left-and-right direction). Accordingly, the edge portions not included in the first region can be easily excluded from the irradiation area by adjusting a scan starting/ending position of the second light beam.

Figure 6A:
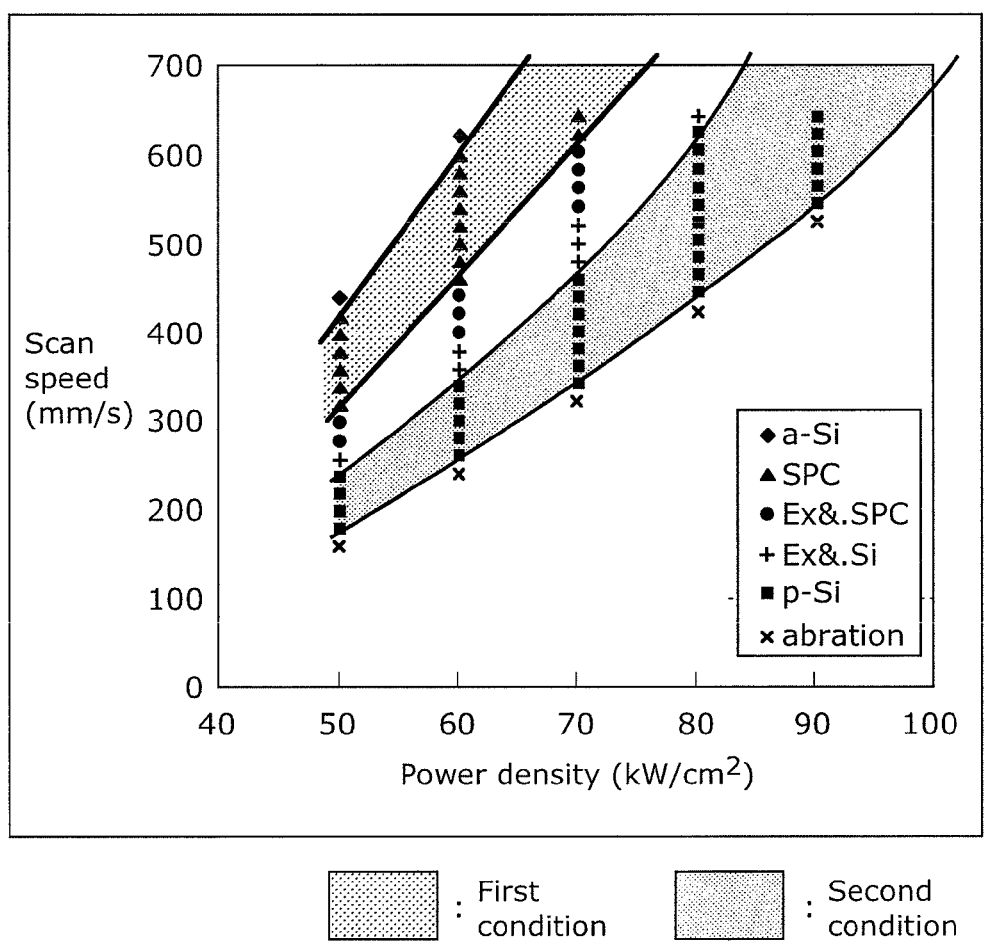
FIG. 6A illustrates an exemplary relation between crystalline states of a silicon thin film and irradiation conditions.
Figure 6B:
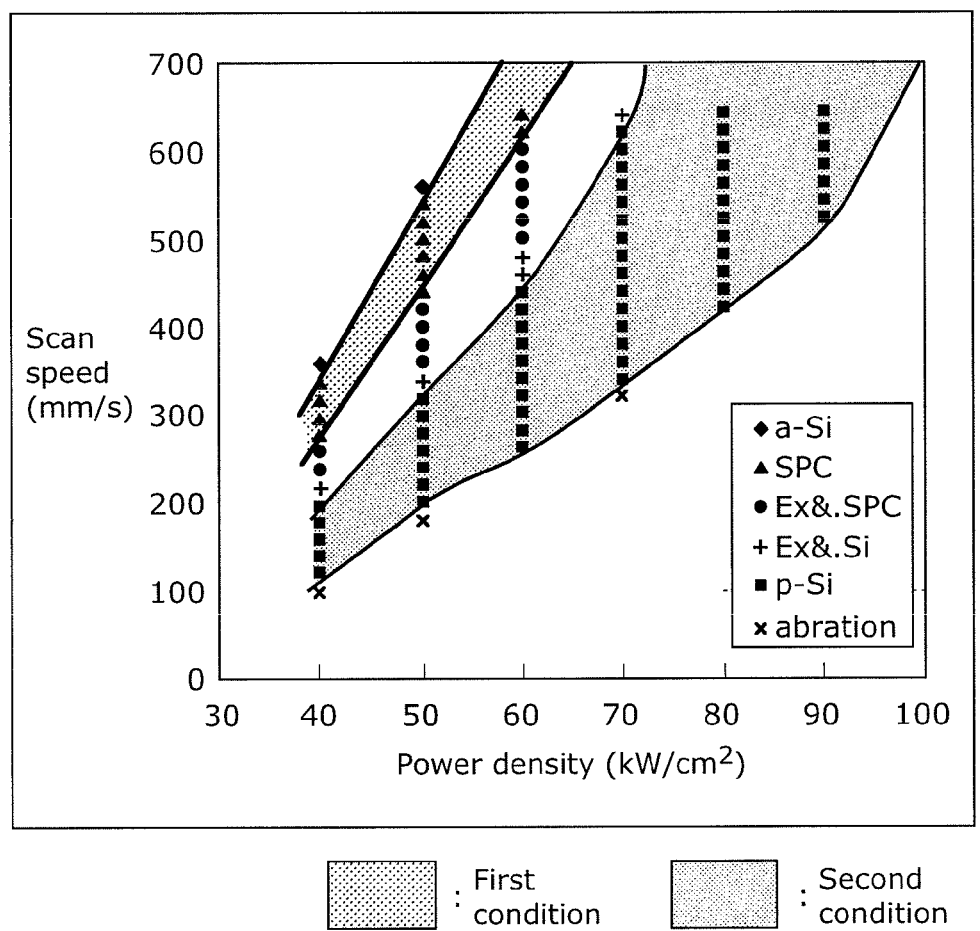
FIG. 6B illustrates another exemplary relation between crystalline states of the silicon thin film and the irradiation conditions.

Referring to FIG. 6A and FIG. 6B, the first condition under which the microcrystalline silicon layer is formed and the second condition under which the polycrystalline silicon layer is formed are described in detail. FIG. 6A illustrates a relation between crystalline states of a silicon thin film 140M and irradiation conditions in the case where the mother substrate 110M having: the under coat layer having a thickness of 500 nm; the gate insulating film 130M composed of a stack of a SiN layer having a thickness of 65 nm and a SiO layer having a thickness of 85 nm; and the silicon thin film 140M having a thickness of 45 nm is irradiated with a CW laser having a short axis view of near-Gaussian, a long axis view of flat-top, a short axis width of 32 μm, and a long axis width of 30 μm. On the other hand, the relation between the crystalline states and the irradiation conditions in FIG. 6B shows results of an experiment under the same condition as FIG. 6A other than the gate insulating film 130M composed of a stack of a SiN layer having a thickness of 85 nm and a SiO layer having a thickness of 70 nm.

The first condition differs from the second condition in irradiation power per unit area of the silicon thin film 140M. The irradiation power per unit area is determined by a combination of laser scan speed (mm/s) and power density (kW/cm$^2$), as shown in FIG. 6A and FIG. 6B.

The irradiation power per unit area of the second condition is greater than the irradiation power per unit area of the first condition. In other words, when the first condition has the same scan speed as the second condition, the second condition requires a power density greater than that of the first condition. When the first condition has the same power density as the second condition, the second condition requires a scan speed lower than that of the first condition.

It should be noted that the irradiation conditions in FIG. 6A and FIG. 6B are merely examples and not limited to these conditions. In other words, any irradiation conditions are possible as long as the second laser beam used in the polycrystalline silicon layer formation is absorbed more readily into the silicon thin film 140M in the second region in comparison with the silicon thin film 140M in the first region.

Figure 7:
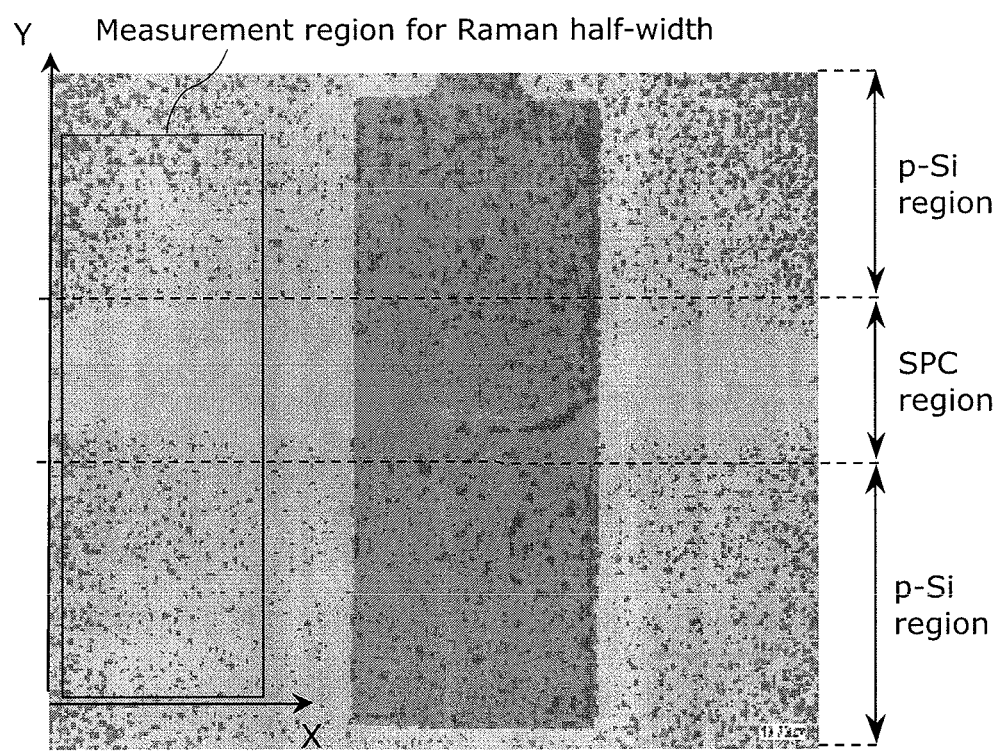
FIG. 7 illustrates a surface state of a silicon thin film irradiated with the first laser beam and the second laser beam.
Figure 8:
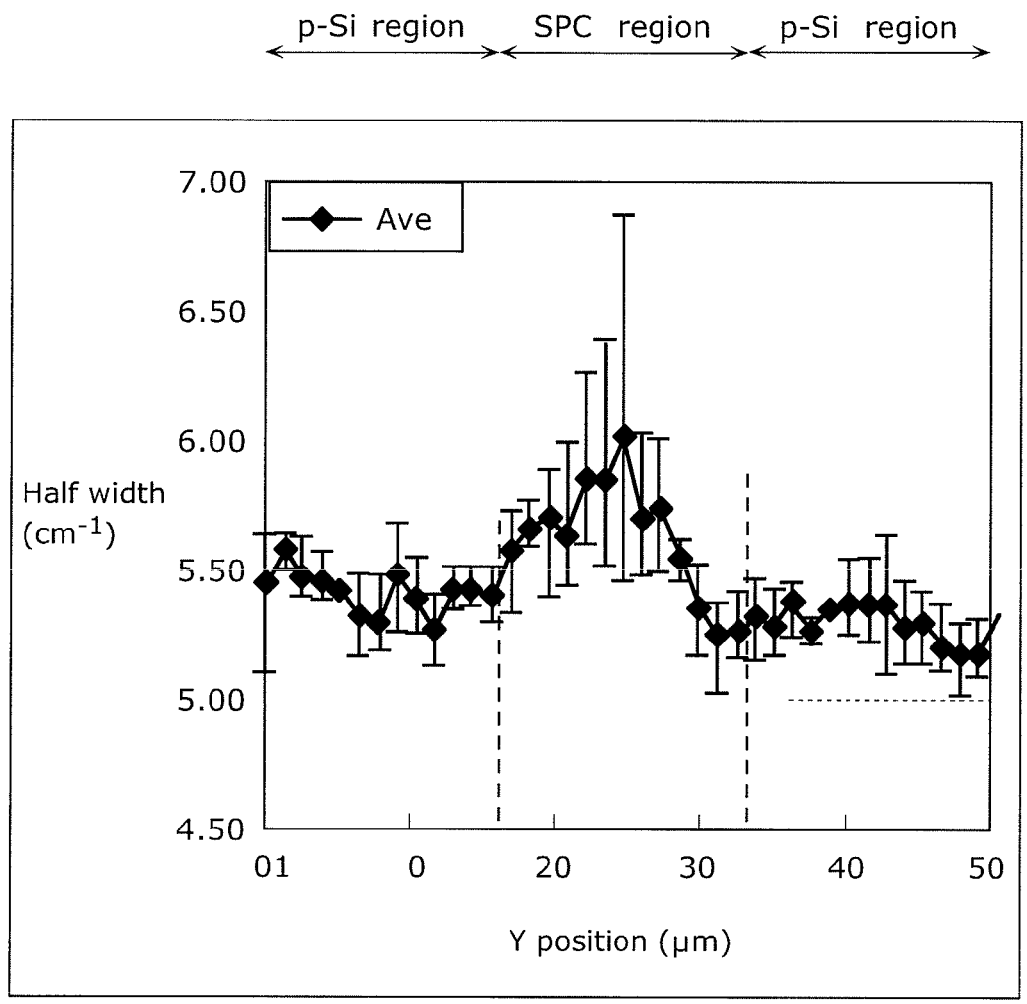
FIG. 8 illustrates measurements of the Raman half-width in a measurement region shown in FIG. 7.

Referring to FIG. 7 and FIG. 8, a crystalline state in the silicon thin film irradiated with the first laser beam and the second laser beam is described. FIG. 7 illustrates a surface state of the silicon thin film irradiated with the first laser beam and the second laser beam. FIG. 8 illustrates measurements of the Raman half-width in a measurement region shown in FIG. 7.

In the non-crystalline silicon thin film, the SPC region (the first region) in FIG. 7 is irradiated with the first laser beam. Subsequently, both the SPC region and the p-Si region (the second region) in FIG. 7 are irradiated with the second laser beam. As a result, as shown in FIG. 7, the SPC region clearly differs from the p-Si region in the surface state. In other words, it is assumed based on the surface state in FIG. 7 that the SPC region differs from the p-Si region in the crystalline state.

Referring to FIG. 8, the Raman half-width in the SPC region is greater than that in the p-Si region. In other words, the silicon in the SPC region has an average grain size smaller than that of the silicon in the p-Si region. It should be noted that an average of the Raman half-widths measured at three points along the X-axis in FIG. 7 is plotted in FIG. 8.

Thus, the first region is irradiated with the first laser in advance to achieve the microcrystallization of the silicon thin film, thereby preventing the crystalline state from changing from the microcrystalline state to the polycrystalline state even when the first region is subsequently irradiated with the second laser beam. This means that the microcrystallized silicon thin film in the first region does not absorb most of the second laser beam.

In other words, in the microcrystalline silicon layer formation and the polycrystalline silicon layer formation, the silicon thin film in the first region is not heated beyond the SPC range that is below the melting point of the amorphous silicon.

In other words, in the first region, an amount of heat propagated from the silicon thin film to the substrate is less than that in the second region. As a result, the tensile stress occurring in the first region of the substrate can be reduced when the substrate is cooled. Accordingly, it is possible to effectively prevent cracks from occurring in the substrate 110 in the first region having many microcracks.

Subsequently, silicon atoms in the silicon thin film 140M are hydrogenated by plasma-treating. In the plasma treatment, hydrogen plasma is generated from gas containing hydrogen gas such as $H_2$ or $H_2$/argon (Ar) by radio-frequency (RF) power, and the silicon thin film 140M is irradiated with the hydrogen plasma. Dangling-bonds (defects) of the silicon atoms are hydrogen-terminated by the hydrogen plasma treatment. Accordingly, the density of crystal defects decreases in the silicon thin film 140M, thereby improving the crystalline property.

Subsequently, as shown in FIG. 2G, the portions of the polycrystalline silicon layer 141a, 141b, 141c, 141d, 141e, and 141f and the microcrystalline silicon layer 142 are formed by patterning the crystallized silicon thin film 140M. More specifically, the portions of the polycrystalline silicon layer 141a to 141f are formed at positions covering the respective gate electrodes 120a to 120f by patterning, and the microcrystalline silicon layer 142 is formed in the scribe region by patterning. It should be noted that, although FIG. 2G shows an example in which the microcrystalline silicon layer 142 is removed in the edge portions, the microcrystalline silicon layer 142 may remain in the edge portions.

Figure 2H:
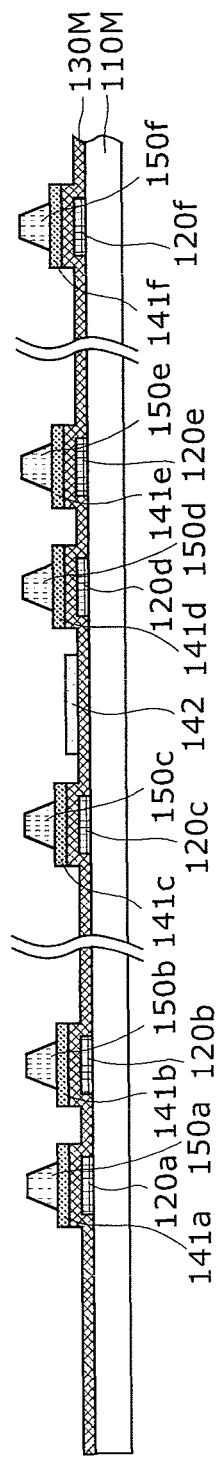
FIG. 2H is a sectional view schematically showing a channel protective layer formation in the method of manufacturing the thin-film semiconductor device according to one exemplary embodiment.

Subsequently, as shown in FIG. 2H, the portions of the channel protective layer 150a, 150b, 150c, 150d, 150e, and 150f are formed on the portions of the polycrystalline silicon layer 141a, 141b, 141c, 141d, 141e, and 141f, respectively. In this case, an insulating film is formed over the entire mother substrate 110M by applying a predetermined organic material for the channel protective layer 150a to 150f by a predetermined coating technique, i.e. spin-coating or slip-coating, such that the polycrystalline silicon layer 141a to 141f and the microcrystalline silicon layer 142 are covered. The thickness of the organic material can be controlled by a viscosity of the organic material or coating conditions (for example, the number of rotation cycles or blade speed). A photosensitive-coating organic material containing silicon, oxygen and carbon may be used as the material of the insulating film.

Subsequently, the insulating film is prebaked for approximately 60 seconds at a temperature of approximately 110 degrees C. In this way, solvent in the insulating film evaporates. Subsequently, the portions of the channel protective layer 150a to 150f are formed in a predetermined pattern by patterning the insulating film with an exposure and development technique using a photomask. Subsequently, the patterned portions of the channel protective layer 150a to 150f are post-baked for approximately an hour at a temperature of 280 to 300 degrees C. to solidify them. Accordingly, a part of the organic components in each of the portions of the channel protective layer 150a to 150f is evaporated and decomposed, thereby forming qualitatively improved portions of the channel protective layer 150a to 150f.

Figure 2I:
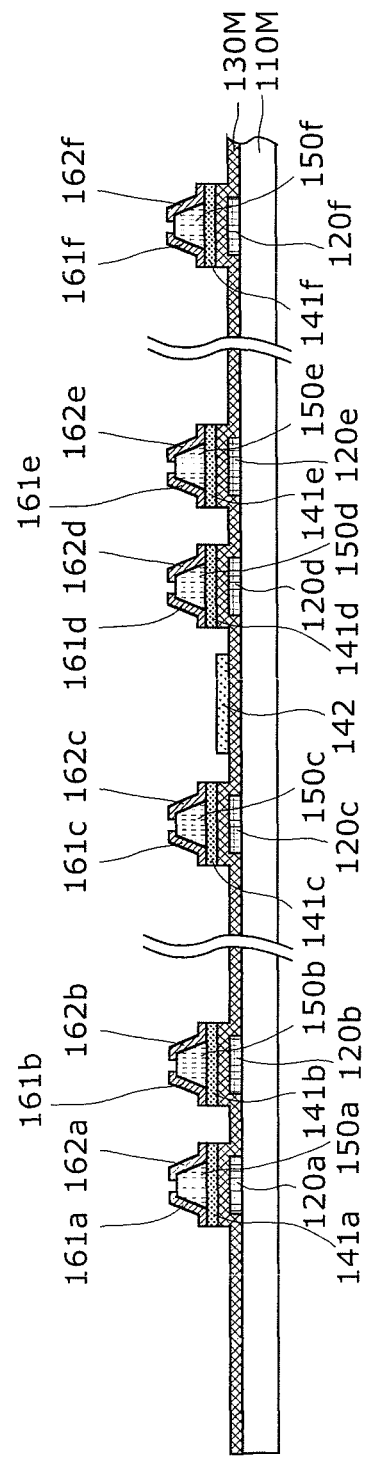
FIG. 2I is a sectional view schematically showing a source/drain electrode formation in the method of manufacturing the thin-film semiconductor device according to one exemplary embodiment.

Subsequently, as shown in FIG. 2I, the source electrodes 161a, 161b, 161c, 161d, 161e, and 161f and the drain electrodes 162a, 162b, 162c, 162d, 162e, and 162f are formed on the portions of the channel protective layer 150a, 150b, 150c, 150d, 150e, and 150f by patterning, respectively. In this case, a source and drain metal film composed of a material for the source electrodes 161a to 161f and the drain electrodes 162a to 162f is grown by sputtering or the like. Subsequently, a resist patterned into a predetermined pattern is formed on the source and drain metal film, and the source and drain metal film is patterned by wet-etching. In this patterning, the portions of the channel protective layer 150a to 150f serve as etching stoppers to protect the respective portions of the polycrystalline silicon layer 141a to 141f. Subsequently, the resist is removed, thereby forming the source electrodes 161a to 161f and the drain electrodes 162a to 162f in the predetermined pattern.

Figure 2J:
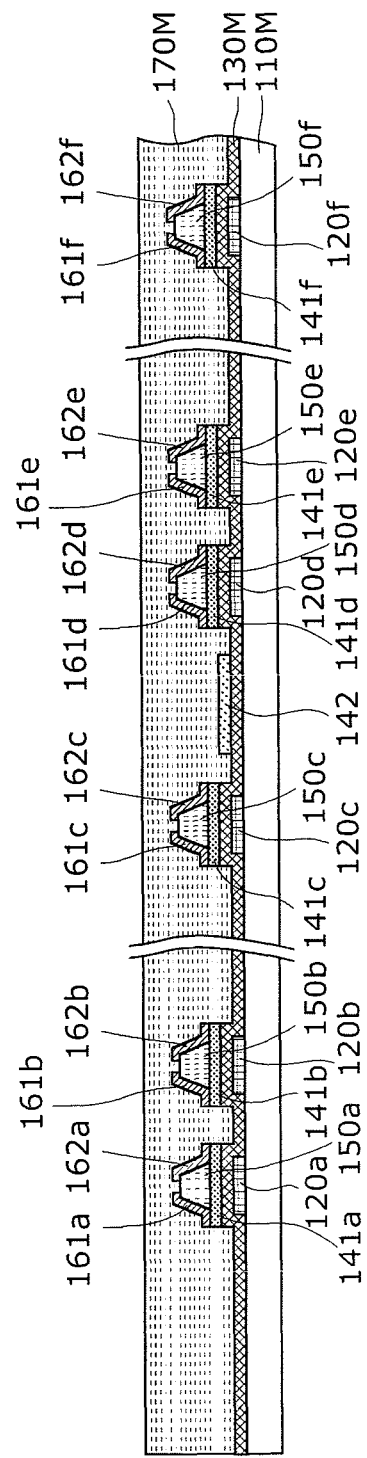
FIG. 2J is a sectional view schematically showing an interlayer insulating film formation in the method of manufacturing the thin-film semiconductor device according to one exemplary embodiment.

Subsequently, as shown in FIG. 2J, the interlayer insulating film 170M is formed over the entire mother substrate 110M to cover the source electrodes 161a to 161f, the drain electrodes 162a to 162f, and the microcrystalline silicon layer 142. More specifically, the interlayer insulating film 170M composed of silicon nitride is deposited over the entire mother substrate 110M by the plasma CVD or the like.

Figure 2K:
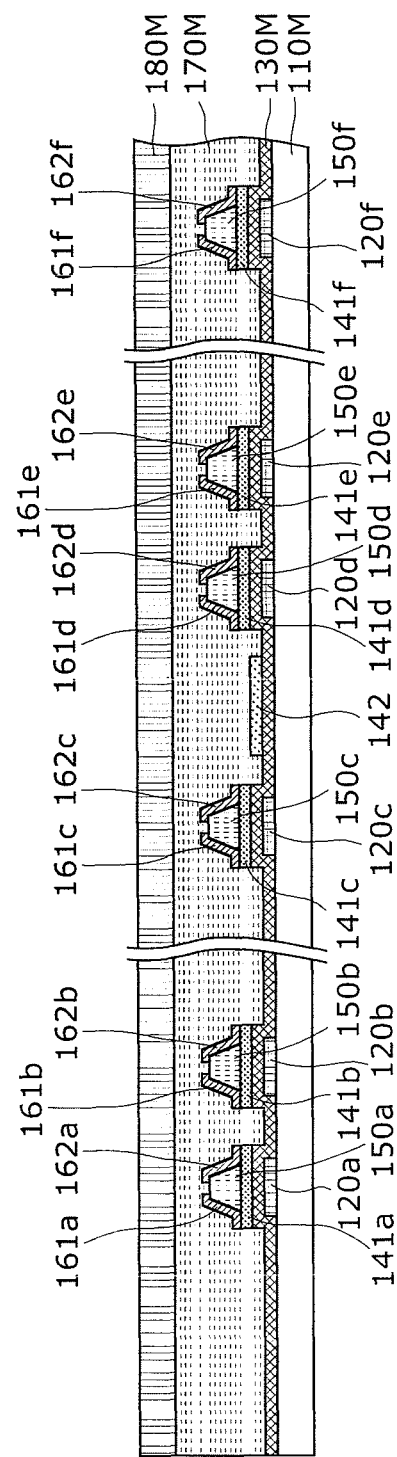
FIG. 2K is a sectional view schematically showing an EL layer formation in the method of manufacturing the thin-film semiconductor device according to one exemplary embodiment.

Subsequently, as shown in FIG. 2K, the EL layer 180 is formed on the interlayer insulating film 170M. More specifically, the anode and the luminescent layer are formed for each pixel, on the interlayer insulating film 170M, and the cathode that is shared with all the pixels is formed on the luminescent layer. The luminescent layer is formed as a stack structure of the hole injection layer, the hole transport layer, the organic luminescent layer, and the electron transport layer.

Figure 2L:
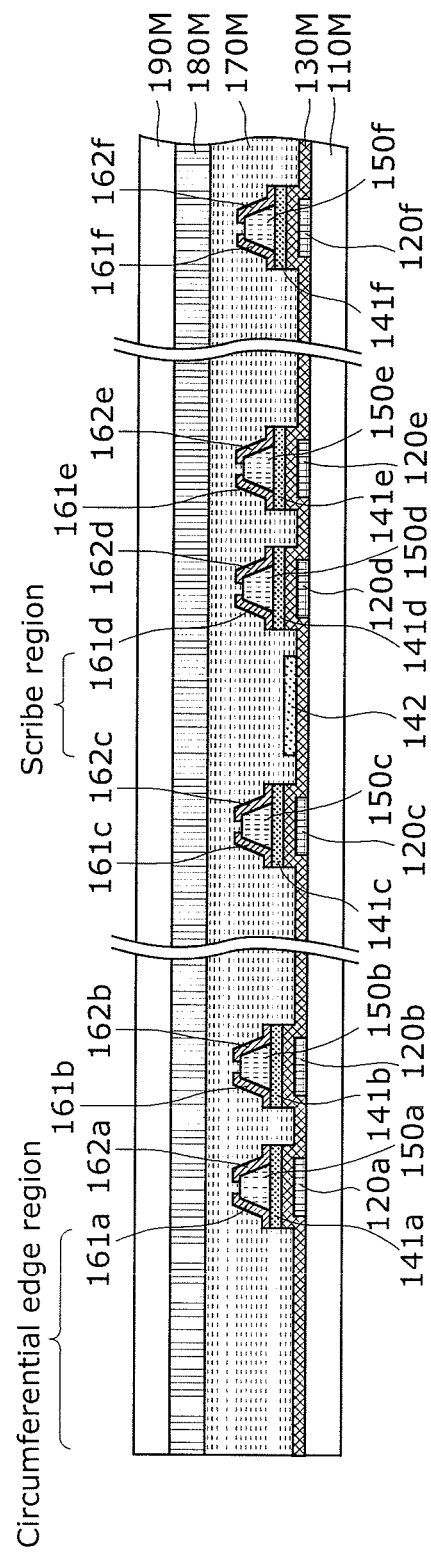
FIG. 2L is a sectional view schematically showing a front glass lamination in the method of manufacturing the thin-film semiconductor device according to one exemplary embodiment.

Subsequently, as shown in FIG. 2L, the EL layer 180 is laminated with the front glass 190. The front glass 190 is a transparent glass that is transmissive of a light emitted from the EL layer 180, and is adhered to the EL layer 180 using transparent resin or the like.

Figure 2M:
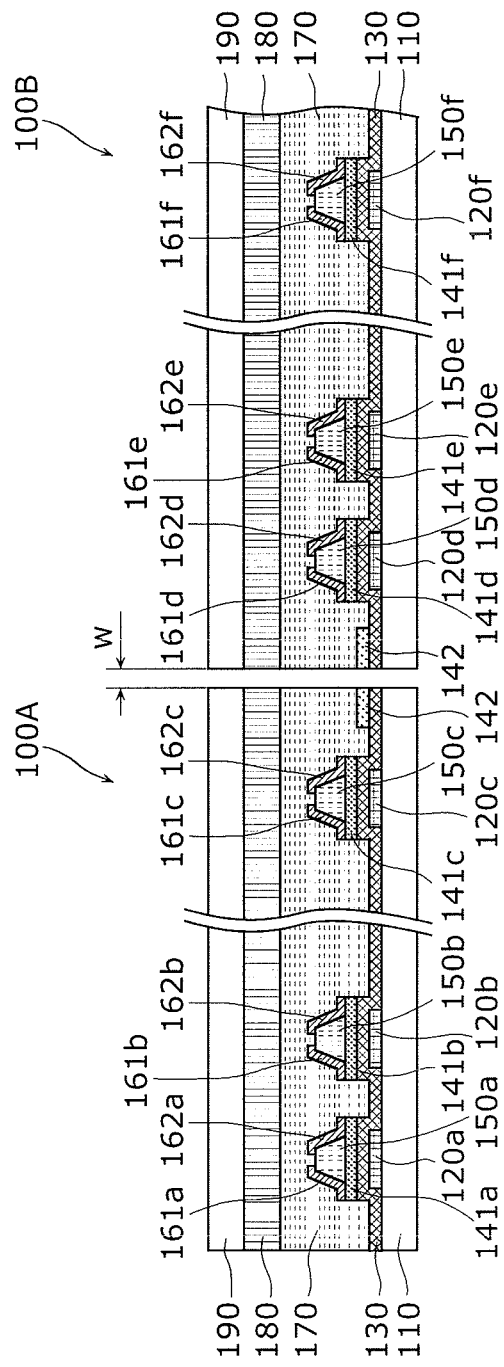
FIG. 2M is a sectional view schematically showing a cutting process in the method of manufacturing the thin-film semiconductor device according to one exemplary embodiment.

Finally, as shown in FIG. 2M, the mother substrate 110M having stacked thin films is cut into substrates 110A and 110B each having a predetermined size. More specifically, the edge portions (the circumferential edge region) shown in FIG. 2L are cut off and the mother substrate 110M is cut on the scribe region in a way that the cutting line is in the microcrystalline silicon layer 142, thereby obtaining the thin-film semiconductor devices 100A and 100B shown in FIG. 2M. The cutting line in FIG. 2M has a width w of approximately 1 to 2 mm. Accordingly, even when the mother substrate 110M is cut on the microcrystalline silicon layer 142 in the scribe region, a part of the microcrystalline silicon layer 142 remains in edge portions of each of the thin-film semiconductor devices 100A and 100B.

The mother substrate 110M may be cut by any cutting method. For example, it is possible to cut with diamond, a cutter, or others. Alternatively, the mother substrate 110M may be cut by forming a cutting groove on the surface of the front glass 190 and applying bending stress to the cutting groove.

In the embodiment, the cutting is performed after the lamination with the front glass 190. The cutting may, however, be performed anytime when the microcrystalline silicon layer and the polycrystalline silicon layer have been formed. For example, the cutting is performed after the formation of the interlayer insulating film 170M, and the following steps (for example, the EL layer formation and the lamination with the front glass) may be performed individually for each thin-film semiconductor device. Accordingly, it is possible to avoid making steps following to the cutting useless even if the thin-film semiconductor device 100A or 100B have to be discarded due to a crack in the substrate 110 which is generated during the cutting.

In the embodiment, however, microcrystallization of the silicon thin film 140M is achieved in the first region that is the scribe region in the substrate 110 where a crack is likely to occur, thereby effectively preventing a crack from occurring in the substrate 110 during the cutting. Accordingly, it is not necessary to worry about the useless steps even when the mother substrate is cut after the lamination with the front glass 190 as described above.

Furthermore, the microcrystalline silicon layer 142 may be removed completely in the channel layer formation. The microcrystalline silicon layer 142, however, serves as the stress buffer layer for preventing a crack from occurring in the substrate 110 due to the external force and the thermal stress acting on the thin-film semiconductor device 100A or 100B, as described above. Accordingly, it is desirable that the microcrystalline silicon layer 142 be not removed purposefully. It should be noted that, although FIG. 2M shows an example in which the microcrystalline silicon layer 142 is left in the region through which the cutting line passes and removed completely in the edge portions of the mother substrate, the microcrystalline silicon layer 142 may remain in both side as shown in FIG. 1.

Figure 9:
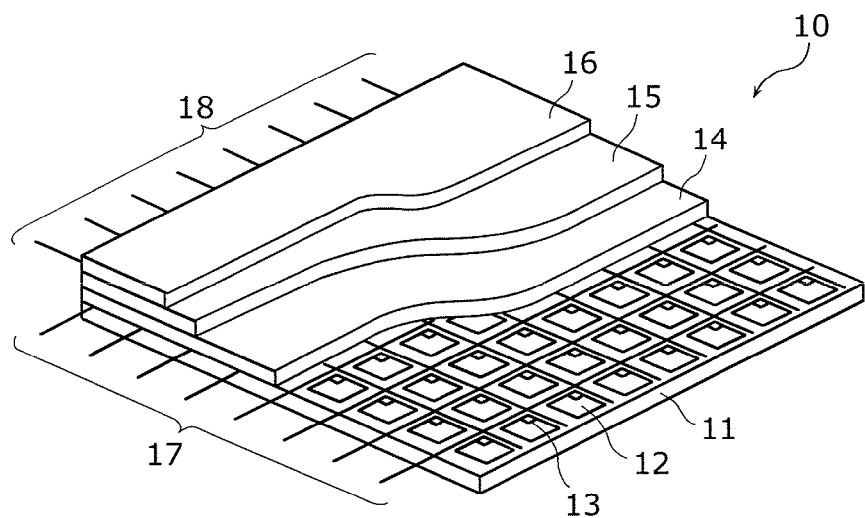
FIG. 9 is a partially cut perspective view of an organic EL display device according to one exemplary embodiment.

Referring to FIG. 9, a description is given of an example where the thin-film transistor 100 according to the embodiment is applied to a display device, and particularly to an organic EL display device. FIG. 9 illustrates a partially cut perspective view of an organic EL display device according to one exemplary embodiment.

As shown in FIG. 9, the organic EL display device 10 includes: an active matrix substrate (TFT array substrate) 11; a plurality of pixels 12 arranged in a matrix on the active matrix substrate 11; a plurality of pixel circuits 13 arranged in a matrix on the active matrix substrate 11 and each connected to a different one of the pixels 12; an anode 14, an organic EL layer 15, and a cathode 16 (transparent electrode) that are sequentially stacked on the pixels 12 and the pixel circuits 13; and a plurality of source lines 17 and gate lines 18 for connecting the pixel circuits 13 to a control circuit (not shown). The organic EL layer 15 includes a stack of an electron transport layer, a luminescent layer, a hole transport layer, and so on.

The thin-film transistors in the thin-film semiconductor device 100 shown in FIG. 1 correspond to switching transistors or driving transistors each formed in a different one of the pixel circuits 13 shown in FIG. 9. Furthermore, the EL layer 180 shown in FIG. 1 corresponds to the anode 14, the organic EL layer 15, and the cathode 16 shown in FIG. 9.

Figure 10:
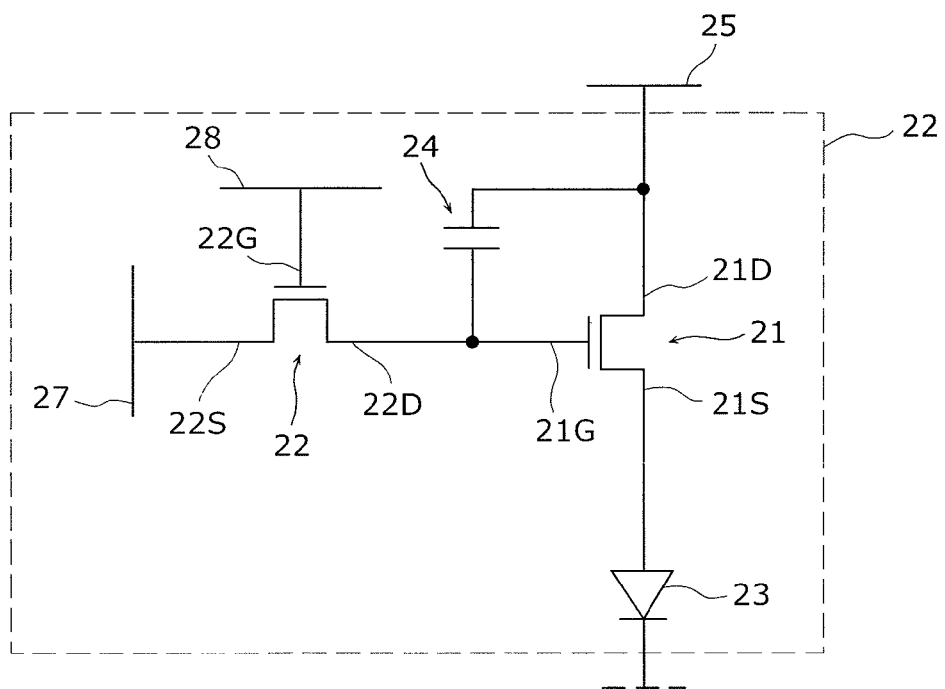
FIG. 10 illustrates a circuit configuration of a pixel circuit according to one exemplary embodiment.
Figure 11:
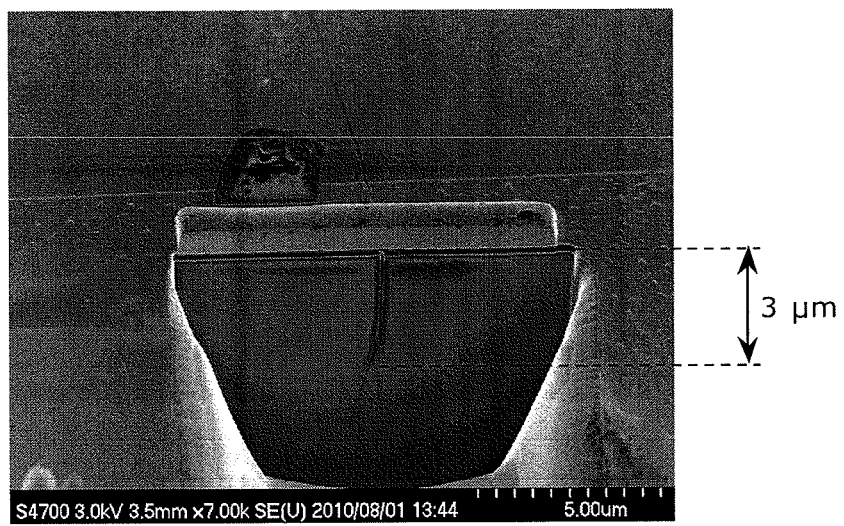
FIG. 11 illustrates a sectional view of a substrate with a crack.
Figure 12:
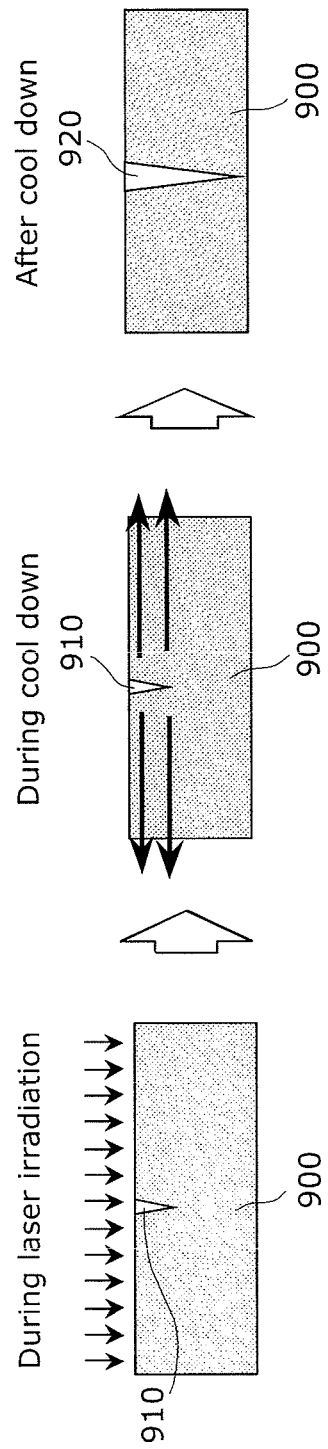
FIG. 12 is a diagram for describing why a crack occurs on a substrate.

Referring to FIG. 10, a description is given of a circuit configuration of the pixel 12 in the organic EL display device 10. FIG. 10 shows a circuit configuration of a pixel included in the thin-film semiconductor device 100 according to one exemplary embodiment.

As shown in FIG. 10, each pixel 12 includes a driving transistor 21, a switching transistor 22, an organic EL device 23, and a capacitor 24. The driving transistor 21 is a transistor that drives the organic EL device 23. The switching transistor 22 is a transistor that selects the pixel 12.

The switching transistor 22 has a source electrode 22S connected to the source line 17, a gate electrode 22G connected to the gate line 18, and a drain electrode 22D connected to the capacitor 24 and a gate electrode 21G of the driving transistor 21. The driving transistor 21 has a drain electrode 21D connected to a power line 25 and a source electrode 21S connected to an anode of the organic EL device 23.

In this configuration, when a gate signal is input into the gate line 18 to turn on the switching transistor 22, the signal voltage supplied via the source line 17 is written into the capacitor 24. The signal voltage written into the capacitor 24 is held for a period of one frame. The held signal voltage causes analog change in conductance of the driving transistor 21 and causes the driving current corresponding to luminescence gradation to flow from the anode to the cathode of the organic EL device 23. This causes the organic EL device 23 to emit light. As a result, a predetermined image is displayed.

In the embodiment, the description is given to the organic EL display device including the organic EL devices. It is, however, possible to apply to another display device including an active matrix substrate, such as a liquid crystal display device. Furthermore, the display device having such a configuration can be used as a flat-panel display, and is applicable to electronic devices such as television sets, personal computers, or mobile phones.

The herein disclosed subject matter is to be considered descriptive and illustrative only, and the appended Claims are of a scope intended to cover and encompass not only the particular embodiment disclosed, but also equivalent structures, methods, and/or uses.

INDUSTRIAL APPLICABILITY

The substrate and method according to one or more exemplary embodiments disclosed herein are advantageously applicable to a thin-film semiconductor device used for pixel circuits and others in a display device.

The invention claimed is:

1. A method of thin film formation, the method comprising:
preparing a substrate;
forming a thin film above the substrate; and
crystallizing the thin film by irradiating the thin film with a light beam, wherein the crystallizing includes steps of:
(a) crystallizing the thin film in a first region into a first crystalline thin film by irradiating the first region while scanning a first light beam relative to the substrate, the first region including at least one of (i) edge portions of the substrate and (ii) a region through which a cutting line passes when the substrate is cut, the first light beam satisfying a first condition; and
(b) subsequently crystallizing the thin film in a second region into a second crystalline thin film by irradiating at least the second region while scanning a second light beam relative to the substrate, the second region being different from the first region, the second light beam satisfying a second condition different from the first condition, and
the thin film has a higher absorption ratio of the second light beam than an absorption ratio of the second light beam of the first crystalline thin film.

2. The method according to claim 1,
wherein in step (b), the first region is also irradiated with the second light beam.

3. The method according to claim 2,
wherein in step (b), the first region and the second region are consecutively irradiated with the second light beam.

4. The method according to claim 1,
wherein crystal grains in the first crystalline thin film have an average grain size smaller than an average grain size of crystal grains in the second crystalline thin film.

5. The method according to claim 1,
wherein crystal grains in the first crystalline thin film have an average grain size of from 10 nm to 40 nm, and crystal grains in the second crystalline thin film have an average grain size of from 50 nm to 1 μm.

6. The method according to claim 1, further comprising
after steps (a) and (b), cutting the substrate in a way that the cutting line is in the first region.

7. The method according to claim 1,
wherein the substrate prepared in the preparing has one of a microcrack, a chipping, and a notch in a region to be covered with the first region.

8. The method according to claim 1,
wherein the edge portions in which the first crystalline thin film is formed comprise only a part of the edge portions that intersects a relative scan direction of the second light beam.

9. The method according to claim 1,
wherein the method is included in a method of forming a thin-film transistor on the substrate, and
the second crystalline thin film includes a channel region of the thin-film transistor.

10. The method according to claim 1,
wherein the light beam is a continuous-wave laser beam.

11. The method according to claim 10,
wherein the laser beam has a wavelength of from 400 nm to 900 nm.

12. The method according to claim 11,
wherein the laser beam has a wavelength of 532 nm.

13. The method according to claim 1,
wherein the thin film comprises a silicon-containing material.

\* \* \* \* \*